United States Patent
Yamamuka et al.

(10) Patent No.: US 8,631,762 B2
(45) Date of Patent: Jan. 21, 2014

(54) PLASMA CVD APPARATUS, METHOD FOR MANUFACTURING SEMICONDUCTOR FILM, METHOD FOR MANUFACTURING THIN-FILM SOLAR CELL, AND METHOD FOR CLEANING PLASMA CVD APPARATUS

(75) Inventors: Mikio Yamamuka, Tokyo (JP); Tae Orita, Tokyo (JP); Hiroya Yamarin, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 254 days.

(21) Appl. No.: 13/121,523

(22) PCT Filed: Oct. 14, 2009

(86) PCT No.: PCT/JP2009/067812
§ 371 (c)(1),
(2), (4) Date: Mar. 29, 2011

(87) PCT Pub. No.: WO2010/050363
PCT Pub. Date: May 6, 2010

(65) Prior Publication Data
US 2011/0177644 A1    Jul. 21, 2011

(30) Foreign Application Priority Data
Oct. 28, 2008   (JP) .................................. 2008-277261

(51) Int. Cl.
*C23C 16/00* (2006.01)

(52) U.S. Cl.
USPC ................ 118/723 ER; 156/345.34; 438/485

(58) Field of Classification Search
USPC ........... 118/723 ER, 723 MR, 723 IR, 723 E; 438/96–98, 485, 788–789, 792–793; 156/345.34
See application file for complete search history.

(56) References Cited

U.S. PATENT DOCUMENTS

| | | | |
|---|---|---|---|
| 5,769,950 A | 6/1998 | Takasu et al. |
| 5,788,778 A | 8/1998 | Shang et al. |
| 5,796,116 A | 8/1998 | Nakata et al. |

(Continued)

FOREIGN PATENT DOCUMENTS

| | | |
|---|---|---|
| DE | 69608821 | 12/2000 |
| JP | 8 97436 | 4/1996 |

(Continued)

OTHER PUBLICATIONS

International Search Report issued Dec. 22, 2009 in PCT/JP09/67812 filed Oct. 14, 2009.

(Continued)

*Primary Examiner* — Richard Booth
(74) *Attorney, Agent, or Firm* — Oblon, Spivak, McClelland, Maier & Neustadt, L.L.P.

(57) ABSTRACT

A plasma CVD apparatus includes: a film forming chamber; a holding member that holds a substrate to be processed that is set in the film forming chamber; a shower head that is set in the film forming chamber to face the holding member, and supplies raw material gas and generates a plasma of the raw material gas; a radical generation chamber that is set at an opposite side of the shower head relative to the holding member and generates radicals of process gas; and an openable and closable shutter that is provided between the shower head and the radical generation chamber.

12 Claims, 15 Drawing Sheets

(56) References Cited

U.S. PATENT DOCUMENTS

| | | | |
|---|---|---|---|
| 5,980,999 A | 11/1999 | Goto et al. | |
| 6,263,830 B1 * | 7/2001 | Kamarehi et al. | 118/723 MW |
| 2002/0129769 A1 | 9/2002 | Kim et al. | |
| 2003/0181060 A1 | 9/2003 | Asai et al. | |
| 2005/0217582 A1 | 10/2005 | Kim et al. | |
| 2006/0102286 A1 * | 5/2006 | Kim | 156/345.35 |
| 2007/0277735 A1 | 12/2007 | Mokhlesi et al. | |
| 2008/0245414 A1 | 10/2008 | Sheng et al. | |

FOREIGN PATENT DOCUMENTS

| | | |
|---|---|---|
| JP | 9 137274 | 5/1997 |
| JP | 9 270387 | 10/1997 |
| JP | 2002 241945 | 8/2002 |
| JP | 2002 294454 | 10/2002 |
| JP | 2004 296599 | 10/2004 |
| JP | 2007 95604 | 4/2007 |
| JP | 2008 211211 | 9/2008 |
| WO | WO 97/37057 | 10/1997 |

OTHER PUBLICATIONS

Combined Office Action and Search Report issued Oct. 18, 2012 in Chinese Patent Application No. 200980141695.2 with English translation and English translation of categories of cited documents.

German Office Action mailed Sep. 26, 2013 for German Patent Application No. 11 2009 002 455.6.

* cited by examiner

VALUE OF POWER
GENERATION EFFICIENCY

- 7-7.2
- 6.8-7

VALUE OF POWER
GENERATION EFFICIENCY

- 7-7.2
- 6.8-7
- 6.6-6.8
- 6.4-6.6
- 6.2-6.4
- 6-6.2

PLASMA CVD APPARATUS, METHOD FOR MANUFACTURING SEMICONDUCTOR FILM, METHOD FOR MANUFACTURING THIN-FILM SOLAR CELL, AND METHOD FOR CLEANING PLASMA CVD APPARATUS

FIELD

The present invention relates to a plasma CVD apparatus, a method for manufacturing a semiconductor film, a method for manufacturing a thin-film solar cell, and a method for cleaning a plasma CVD apparatus.

BACKGROUND

Conventionally, in a thin-film solar cell, there is used a tandem structure having plural photoelectric conversion layers (semiconductor layers) made of materials of different bandgaps stacked on a translucent insulating substrate so as to widely and effectively use a solar spectrum. Particularly, in a case of thin-film solar cells of a silicon series, a structure having amorphous silicon cells and microcrystalline silicon cells stacked as a semiconductor layer is employed in many cases. Each of the cells has a three-layer structure having a P-type semiconductor film, an I-type semiconductor film, and an N-type semiconductor film sequentially stacked thereon. The I-type semiconductor film is an electric-power generation layer, and the P-type semiconductor film and the N-type semiconductor film are layers for forming an internal electric field.

Generally, in microcrystalline silicon cells, a film including many microcrystalline-silicon crystalline grains that are oriented in the (220) plane is preferable as the I-type semiconductor film of an electric-power generation layer, and crystalline grains that are oriented in the (111) plane are regarded unsuitable. This is because grain boundaries of microcrystalline silicon crystals that are oriented in the (111) plane easily adsorb impurities such as oxygen, carbon, and nitrogen from open air. When these impurities are adsorbed, a film that includes these crystalline grains functions as a leak current path. Consequently, when this film is applied to a thin-film solar cell, power generation efficiency is considerably lowered.

However, it has been known that when a microcrystalline-silicon thin film is formed by a chemical vapor deposition (CVD) method or the like, crystalline grains that are oriented in the (111) plane are more stable and grow in higher priority than crystalline grains that are oriented in the (220) plane. Over several decades, many enterprises and research organizations in the world have hitherto made researches and developments concerning a film forming processing technique to grow a microcrystalline silicon film that is perfectly oriented in the (220) plane without including the (111) plane orientation. However, no effective solution has been found yet.

Therefore, according to a conventional method for manufacturing a microcrystalline silicon film for a thin-film solar cell, the following examination has been made. That is, a plasma is generated by introducing hydrogen gas into a film forming chamber after a microcrystalline silicon film is formed. Crystalline grain boundaries in the microcrystalline silicon film are passivated by hydrogen radicals (H) that are generated by plasma dissociation, thereby reducing adsorption of impurities (see, for example, Patent Literature 1).

The following examination has been also made. That is, a radical generation chamber is provided at a side of a film forming chamber of a microcrystalline silicon film, and after a microcrystalline silicon film is formed, hydrogen radicals (H) generated in the radical generation chamber are introduced into the film forming chamber. Grain boundaries of microcrystalline silicon that are oriented in the (111) plane are passivated by the hydrogen radicals (H), thereby reducing adsorption of impurities (see, for example, Patent Literature 2).

CITATION LIST

Non Patent Literature

Patent Literature 1: Japanese Patent Application Laid-open No. H8-97436
Patent Literature 2: Japanese Patent Application Laid-open No. H9-137274

SUMMARY

Technical Problem

However, according to the method for manufacturing microcrystalline silicon in Patent Literature 1 mentioned above, a hydrogen plasma is generated on a formed microcrystalline silicon film. Therefore, hydrogen (H) ions in the plasma are accelerated by a sheath electric field and are attracted by the substrate. Therefore, there is a problem that the hydrogen (H) ions collide against a generated microcrystalline silicon film and cause damage and defects.

According to the microcrystalline silicon film manufactured by using the thin-film manufacturing device in Patent Literature 2 mentioned above, hydrogen radicals (H) from the radical generation chamber adjacent to a side of the film forming chamber are introduced into the film forming chamber. Therefore, there is a problem that hydrogen radicals (H) are not uniformly supplied to an entire surface of the microcrystalline silicon film, and a large in-plane distribution is generated with respect to a passivation effect of the crystalline grain boundaries due to the hydrogen radicals (H). That is, hydrogen radicals (H) sufficiently reach a film positioned close to the radical generation chamber, and a high passivation effect is obtained. On the other hand, hydrogen radicals (H) do not sufficiently reach a position far from the radical generation chamber, and thus there is a decrease in a passivation effect. Normally, a thin-film solar-cell element is generated on a large-area glass substrate having one meter or more in one side. Therefore, this in-plane distribution directly causes a reduction of yield. Consequently, it is expected that serious problems are generated when mass production is taken into consideration.

Furthermore, a microcrystalline silicon film that is applied to an electric-power generation layer of a thin-film solar cell has a thickness of about several micrometers in general. The quantity of a residual film adhered on the inside of the film forming chamber after film formation is large, and the residual film needs to be removed by cleaning the film forming chamber at each time films are formed. Normally, for example, fluorinated gas, such as carbon tetrafluoride gas, nitrogen trifluoride gas, and sulphur hexafluoride gas is introduced into a film forming chamber as cleaning gas. A plasma is then generated in the film forming chamber, and fluorine-atom radicals are generated, thereby etching the silicon residual film that is adhered on an internal wall of the film forming chamber. When the cleaning process described above is performed by the thin-film manufacturing devices described in Patent Literature 1 and Patent Literature 2 mentioned above, the internal wall of the film forming chamber, particularly a surface of a shower plate on which a highelectric-field sheath is formed, is damaged by ion bombardment. Each time when a film forming process is repeated, a device state changes with age, and there is a possibility that film forming stability is degraded.

The present invention has been achieved in view of the above problems, and an object of the present invention is to provide a plasma CVD apparatus that performs a uniform hydrogen-passivation process by uniformly supplying hydrogen radicals to an entire surface of a microcrystalline silicon film and can clean a residual film on an internal wall of a film forming chamber without causing any damage thereon, a method for manufacturing a semiconductor film, a method for manufacturing a thin-film solar cell, and a method for cleaning a plasma CVD apparatus.

Solution to Problem

In order to solve above-mentioned problems and to achieve the object, a plasma CVD apparatus according to the present invention includes, a film forming chamber, a holding member that holds a substrate to be processed that is set in the film forming chamber, a shower head that is set in the film forming chamber to face the holding member, and supplies raw material gas and generates a plasma of the raw material gas, a radical generation chamber that is set at an opposite side of the shower head relative to the holding member and generates radicals of process gas, and an openable and closable shutter that is provided between the shower head and the radical generation chamber.

Advantageous Effects of Invention

According to the present invention, a passivation process can be performed uniformly on an entire surface of a microcrystalline silicon film while preventing damage and defects of the microcrystalline silicon film by uniformly supplying hydrogen radicals onto an entire surface of the microcrystalline silicon film. A residual film in a film forming chamber can be cleaned without causing any damage thereon by ion bombardment on an internal wall of the film forming chamber including a shower head.

BRIEF DESCRIPTION OF DRAWINGS

FIG. 2-1 is a perspective view for explaining a shutter provided between a film forming chamber of the manufacturing device of a microcrystalline silicon film according to the first embodiment of the present invention and a radical generation chamber.

FIG. 2-2 is a perspective view for explaining the shutter provided between the film forming chamber of the manufacturing device of a microcrystalline silicon film according to the first embodiment of the present invention and the radical generation chamber.

FIG. 2-3 is a perspective view for explaining the shutter provided between the film forming chamber of the manufacturing device of a microcrystalline silicon film according to the first embodiment of the present invention and the radical generation chamber.

FIG. 2-4 is a perspective view for explaining the shutter provided between the film forming chamber of the manufacturing device of a microcrystalline silicon film according to the first embodiment of the present invention and the radical generation chamber.

FIG. 3 is a schematic diagram of a positional relationship between respective members when the manufacturing device of a microcrystalline silicon film according to the first embodiment of the present invention is viewed from an upper surface.

FIG. 4 is a schematic diagram of a state that the manufacturing device of a microcrystalline silicon film according to the first embodiment of the present invention performs a passivation process by hydrogen radicals.

FIG. 11-1 is a plan view of a schematic configuration of a module having an electric-power generation layer that is formed by using the manufacturing device of a microcrystalline silicon film according to the first embodiment of the present invention.

FIG. 11-2 is a cross-sectional view of relevant parts for explaining a cross-sectional structure of thin-film solar battery cells (microcrystalline silicon cells) having an electric-power generation layer that are formed by using the manufacturing device of a microcrystalline silicon film according to the first embodiment of the present invention.

FIG. 17-1 is a schematic diagram for explaining a method for manufacturing a microcrystalline silicon film according to a third embodiment of the present invention.

FIG. 17-2 is a schematic diagram for explaining the method for manufacturing a microcrystalline silicon film according to the third embodiment of the present invention.

FIG. 17-3 is a schematic diagram for explaining the method for manufacturing a microcrystalline silicon film according to the third embodiment of the present invention.

FIG. 17-4 is a schematic diagram for explaining the method for manufacturing a microcrystalline silicon film according to the third embodiment of the present invention.

DESCRIPTION OF EMBODIMENTS

Figure 1:
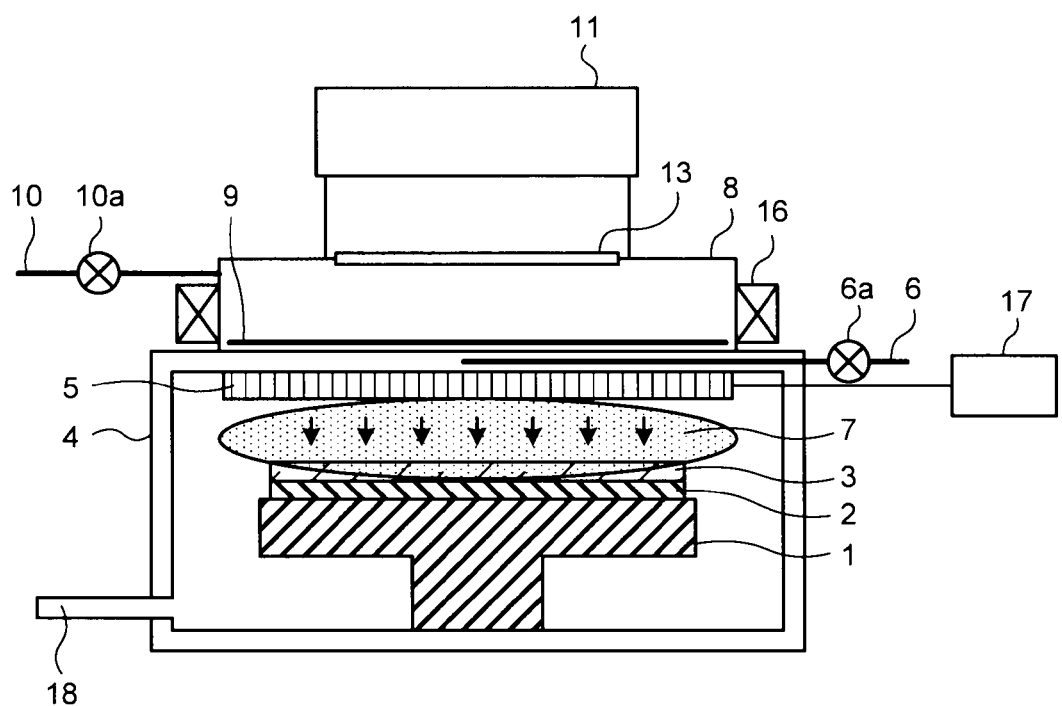
FIG. 1 is a schematic diagram of a cross-sectional structure of a manufacturing device of a microcrystalline silicon film according to a first embodiment of the present invention.

Exemplary embodiments of a manufacturing device of a microcrystalline silicon film, a method for manufacturing a microcrystalline silicon film, a manufacturing device of a thin-film solar cell, and a method for manufacturing a thin-film solar cell according to the present invention will be explained below in detail with reference to the accompanying drawings. The present invention is not limited to the following descriptions, and modifications can be appropriately made without departing from the scope of the invention. In the drawings explained below, scales of respective members may be shown differently from those in practice to facilitate understanding. The same applies to relationships between the drawings.

First Embodiment

FIG. 1 is a schematic diagram of a cross-sectional structure of a manufacturing device of a microcrystalline silicon film according to a first embodiment of the present invention. FIG. 1 depicts a state that the manufacturing device of a microcrystalline silicon film forms a microcrystalline silicon film. As shown in FIG. 1, a substrate stage 1 as a holding member, which holds a translucent insulating substrate 2 as a substrate to be processed, is set in a film forming chamber 4 having a substantially rectangular parallelepiped shape. The substrate stage 1 is grounded. The translucent insulating substrate 2 is held on the substrate stage 1 such that a film forming surface is horizontal and faces upward.

A shower head 5 that diffuses and supplies raw material gas to an upper region of the substrate stage 1 is provided to face the substrate stage 1 on an upper surface of the film forming chamber 4. A pipe 6 that supplies raw material gas into the film forming chamber 4 is connected to the shower head 5. The quantity of the raw material gas to be supplied to the film forming chamber 4 can be adjusted by a valve 6a that is attached to the pipe 6. The shower head 5 has a shower plate having many holes facing the substrate stage 1, and a gas chamber that diffuses the raw material gas that is supplied to the shower plate at the opposite side of the substrate stage 1. The shower head 5 also works as a high-frequency electrode to generate a plasma of the raw material gas. A power source 17 that applies high-frequency power to the shower head 5 is connected to the shower head 5. An exhaust unit (not shown) is connected to a lower part of the film forming chamber 4 via an exhaust pipe 18, and the exhaust unit can evacuate air from the inside of the film forming chamber 4.

The manufacturing device has a radical generation chamber 8 that generates radicals of process gas to be supplied to the film forming chamber 4, at an opposite side of the shower head 5 relative to the substrate stage 1, that is, on the film forming chamber 4 in FIG. 1. The process gas is introduced into the radical generation chamber 8, and radicals are generated by generating a plasma of the process gas in a high-frequency electric field of an RF wave or a microwave. In the first embodiment, hydrogen gas is used for the process gas, and hydrogen radicals are supplied after a film is formed. The radical generation chamber 8 that generates the hydrogen radicals is provided via a shutter 9 that is made of metal and has openable and closable holes between the radical generation chamber 8 and the shower head 5. The shutter 9 can open and close a region that is superimposed with an entire surface of the film forming surface of the translucent insulating substrate 2.

Figures 1, 2:
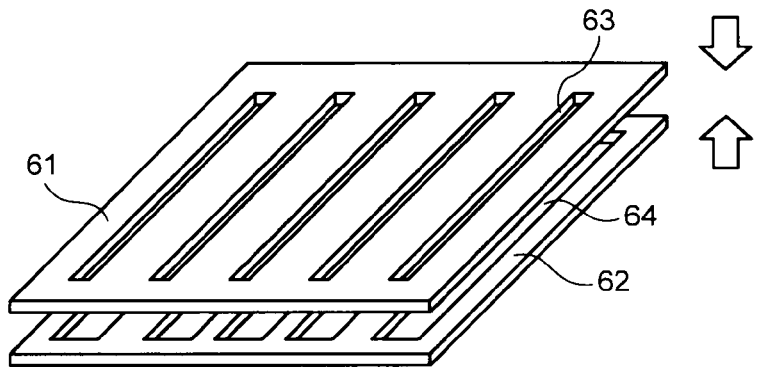
Figure 2:
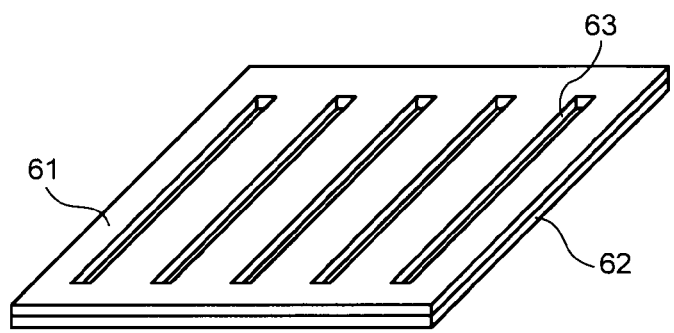
Figures 2, 3:
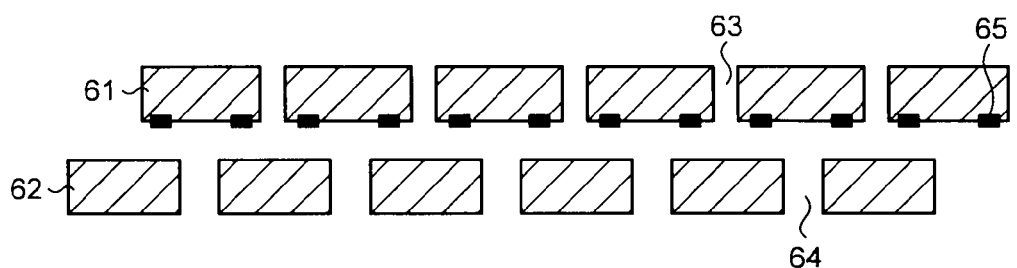
Figures 2, 3, 4:
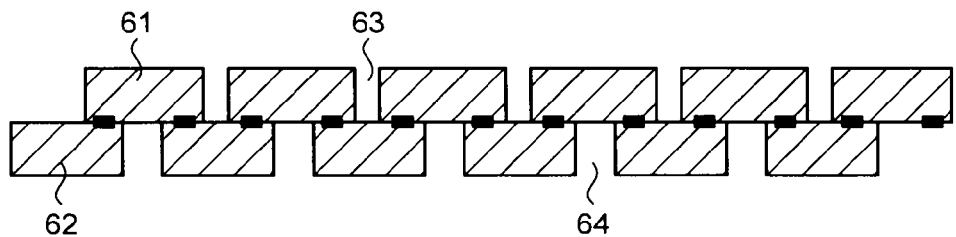
Figure 3:
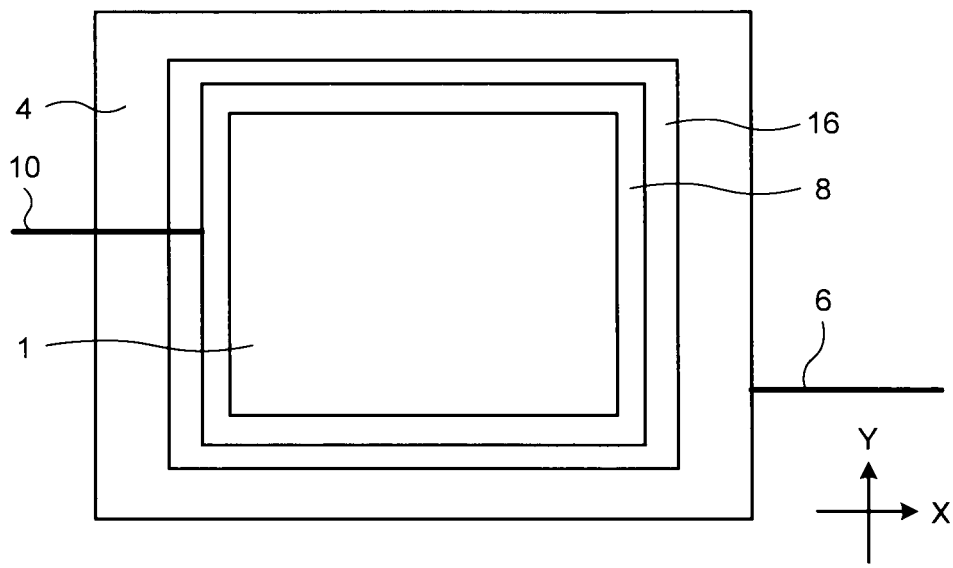
Figure 4:
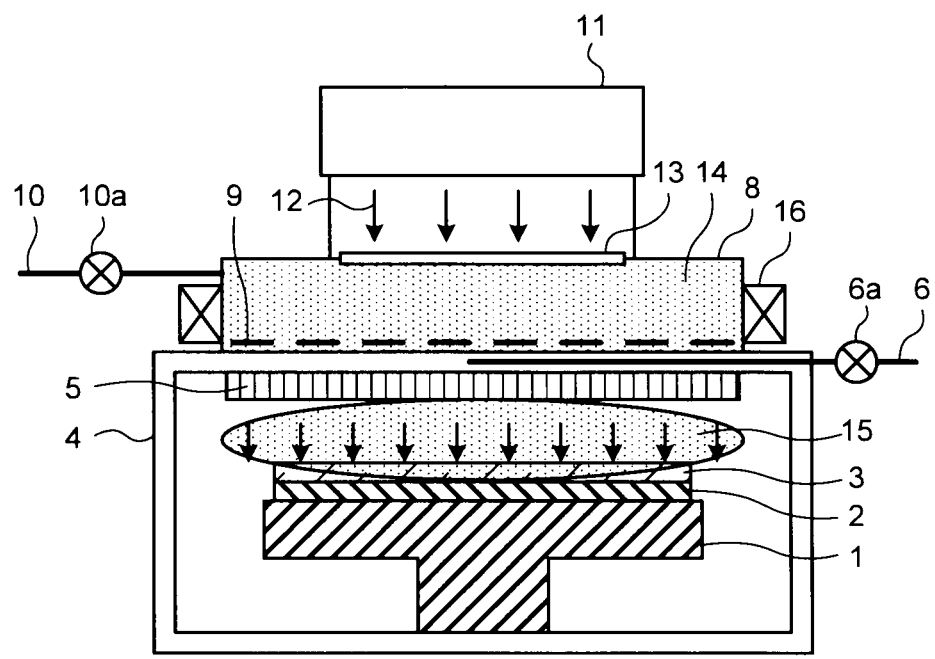

FIGS. 2-1 to 2-4 are schematic diagrams for explaining the shutter 9, where FIGS. 2-1 and 2-2 are perspective views of the shutter 9, and FIGS. 2-3 and 2-4 are cross-sectional views of the shutter 9. The shutter has a structure having a shutter upper plate 61 and a shutter lower plate 62 superimposed with each other. The shutter upper plate 61 and the shutter lower plate 62 have groove-like holes 63 and holes 64, respectively. FIGS. 2-1 and 2-3 depict a state that the shutter 9 is opened, and FIGS. 2-2 and 2-4 depict a state that the shutter 9 is closed. That is, the shutter 9 is set to be an open state by separating the shutter upper plate 61 and the shutter lower plate 62 from each other, and the shutter 9 is set to be a closed state by superimposing the shutter upper plate 61 and the shutter lower plate 62 to bring them close to each other. When the shutter 9 is in an open state as shown in FIG. 2-3, radicals generated in the radical generation chamber 8 pass through the holes 63 and 64, and are introduced into the film forming chamber 4. As shown in FIGS. 2-3 and 2-4, the shutter 9 has shutter O-rings 65 between the shutter upper plate 61 and the shutter lower plate 62. During a film forming process when the shutter 9 is closed, a space between the holes 63 and 64 is eliminated completely, and thus mixing of raw material gas from the film forming chamber 4 into the radical generation chamber 8 can be prevented. Mixing of raw material gas into the radical generation chamber 8 can be also prevented when the shutter 9 is structured to have no shutter O-ring 65 and also when a higher pressure is maintained in the radical generation chamber 8 than a pressure in the film forming chamber 4 by sealing hydrogen gas in the radical generation chamber 8 during film formation.

An electromagnet 16 is arranged around an external periphery of the radical generation chamber 8. A pipe 10 that supplies hydrogen gas to the radical generation chamber 8 is connected to the radical generation chamber 8. The quantity of the raw material gas to be supplied to the radical generation chamber 8 can be adjusted by a valve 10a that is attached to the pipe 10. A power source 11 that generates a microwave 12 and introduces the microwave 12 into the radical generation chamber 8 is arranged on the radical generation chamber 8 via a window 13.

FIG. 3 is a schematic diagram of a positional relationship between respective members when the manufacturing device of a microcrystalline silicon film according to the first embodiment of the present invention is viewed from an upper surface. FIG. 3 depicts a transparent display of the inside of the film forming chamber 4 at a lower part of the radical generation chamber 8. As shown in FIG. 3, the sizes in a vertical direction (depth direction) and in a lateral direction (width direction) of the radical generation chamber 8 is larger by 1.1 times or more than those in a vertical direction (depth direction) and in a lateral direction (width direction) of the substrate stage 1, respectively. As explained above, the manufacturing device of a microcrystalline silicon film according to the first embodiment has the radical generation chamber 8 above the film forming chamber 4. The radical generation chamber 8 has larger sizes in a vertical direction (depth direction) and a larger size in a lateral direction (width direction) than those of the substrate stage 1, that is, larger sizes than those of the translucent insulating substrate 2. The size of a bottom surface is larger than that of the translucent insulating substrate 2. A wall having a distribution of plural openings is present in a region equal to or larger than that of the substrate stage 1, between the radical generation chamber 8 and the shower head 5. These openings are all opened and closed by the shutter 9. With this arrangement, after film formation, hydrogen radicals can be uniformly supplied from the bottom surface of the radical generation chamber 8 to an entire surface of a microcrystalline silicon film. Crystalline grain boundaries of microcrystalline silicon that are oriented in the (111) plane can be uniformly passivated in the plane of the microcrystalline silicon film. The vertical direction (depth direction) is a Y direction shown in FIG. 3, which is a short direction of a horizontal direction of the film forming chamber 4. The lateral direction (width direction) is an X direction shown in FIG. 3, which is a long direction of a horizontal direction of the film forming chamber 4.

A film forming process of a microcrystalline silicon film by the manufacturing device of a microcrystalline silicon film according to the first embodiment is explained next. When a film forming process of a microcrystalline silicon film is performed, air in the film forming chamber 4 is evacuated via the exhaust pipe 18 by an exhaust unit (not shown), and the inside of the film forming chamber 4 is set to be a vacuum state. Raw material gas such as silane gas is then sent to the inside of the film forming chamber 4 through the pipe 6, and the raw material gas is diffused and supplied to the upper region of the substrate stage 1 via the shower head. A supply quantity of the raw material gas can be adjusted by the valve 6a that is attached to the pipe 6.

When an electric field is generated between the shower head 5 and the substrate stage 1 by applying high-frequency power to the shower head 5 from the power source 17 in the above state, the raw material gas is excited and a plasma is generated in a plasma generation region, that is, in a region where the translucent insulating substrate 2 and the shower head 5 face each other. The raw material gas is decomposed by a plasma. As a result, a film forming precursor 7 is generated. The film forming precursor 7 is deposited on the translucent insulating substrate 2, and a microcrystalline silicon film 3 grows as a semiconductor film. During a period while the microcrystalline silicon film 3 is being formed, the shutter 9 is in a closed state as shown in FIG. 1, thereby suppressing mixing of the film forming precursor 7 into the radical generation chamber 8.

FIG. 4 is a schematic diagram of a state that the manufacturing device of a microcrystalline silicon film according to the first embodiment performs a passivation process by hydrogen radicals. When a passivation process by hydrogen radicals is performed, after a microcrystalline silicon film is formed, hydrogen gas is supplied to the radical generation chamber 8 through the pipe 10, the microwave 12 generated by the power source 11 is introduced into the radical generation chamber 8, and a microwave plasma 14 is generated in the radical generation chamber 8. A supply quantity of the hydrogen gas can be adjusted by the valve 10a that is attached to the pipe 10. The film forming chamber 4 is set to be a vacuum atmosphere.

At this time, holes are opened in a region of the shutter 9 that is superimposed with an entire surface of a film forming surface, and hydrogen radicals 15 generated by a dissociation reaction of the microwave plasma 14 are introduced into the film forming chamber 4. In this case, substantially an entire surface of a lower surface of the radical generation chamber 8 is opened, and the hydrogen radicals 15 can be introduced into the film forming chamber 4 via the shutter 9 from substantially the entire surface of the lower surface of the radical generation chamber 8. The hydrogen radicals 15 are introduced into the film forming chamber 4 in this way, and the hydrogen radicals 15 are uniformly irradiated onto the microcrystalline silicon film 3 that is formed on an upper surface of the translucent insulating substrate 2. Consequently, grain boundaries of the microcrystalline silicon film 3 can be uniformly hydrogen-passivated.

In FIG. 4, the height of the substrate stage 1 is set higher than that when the microcrystalline silicon film 3 shown in FIG. 1 is formed, and the microcrystalline silicon film 3 formed on the translucent insulating substrate 2 on the substrate stage 1 is set closer to the shower head 5. With this arrangement, the proportion of the hydrogen radicals 15 that are introduced into the film forming chamber 4 and are lost by recoupling or the like before the hydrogen radicals 15 reach the microcrystalline silicon film 3 is reduced, a sufficient quantity of the hydrogen radicals 15 can be provided to reach the microcrystalline silicon film 3, and a hydrogen passivation effect in the crystalline grain boundaries can be obtained more effectively.

As shown in FIG. 3, the sizes in a vertical direction (depth direction) and in a lateral direction (width direction) of the radical generation chamber 8 is larger than those in a vertical direction (depth direction) and in a lateral direction (width direction) of the substrate stage 1, respectively. At the same time, as shown in FIG. 4, the sizes in a vertical direction (depth direction) and those in a lateral direction (width direction) of the shutter 9 and the shower head 5, respectively are also designed about the same as the size in a vertical direction (depth direction) and in a lateral direction (width direction) of the radical generation chamber 8. Based on these configurations, the manufacturing device of a microcrystalline silicon film according to the first embodiment can securely and uniformly irradiate the hydrogen radicals 15 introduced in the film forming chamber 4 onto the entire surface of the microcrystalline silicon film 3, and the grain boundaries of the microcrystalline silicon film can be uniformly hydrogen-passivated.

Figure 5:
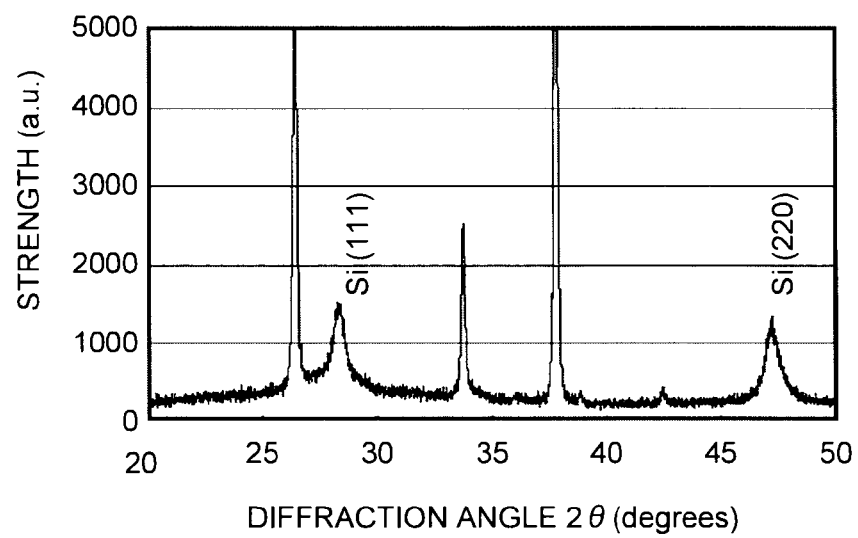
FIG. 5 is a characteristic diagram of an example of an X-ray diffraction (XRD) spectrum of a microcrystalline silicon film that is grown on a transparent electrode substrate by the manufacturing device of a microcrystalline silicon film according to the first embodiment of the present invention.

FIG. 5 is a characteristic diagram of an X-ray diffraction (XRD) spectrum, measured by an X-ray diffraction (XRD) method, of a microcrystalline silicon film that is grown by 1 micrometer on a transparent electrode substrate by the manufacturing device of a microcrystalline silicon film according to the first embodiment. The transparent electrode substrate that has a tin oxide ($SnO_2$) film and a zinc oxide (ZnO) film formed on a glass substrate in this order is used. FIG. 5 depicts a diffraction angle 2θ (degrees) in a lateral axis, and strength (a.u.) in a vertical axis. As shown in FIG. 5, a peak of silicon (Si) that is oriented in the (111) plane is observed in about the same strength as that of silicon (Si) that is oriented in the (220) plane. It can be understood that a microcrystalline silicon film including many silicon crystalline grains that are oriented in the (111) plane is obtained.

A passivation process by hydrogen radicals is performed to the microcrystalline silicon film by the manufacturing device of a microcrystalline silicon film. Thereafter, a depth-direction profile of a content of an element in the film is evaluated by analyzing the quantity of an impurity in the microcrystalline silicon film by the SIMS (Secondary Ion Mass Spectrometry) method. As an element to be analyzed by the SIMS method, hydrogen (H) used for passivation is selected in addition to carbon (C), oxygen (O), and nitrogen (N) that are considered to be most easily adsorbed from the atmosphere.

Figure 6:
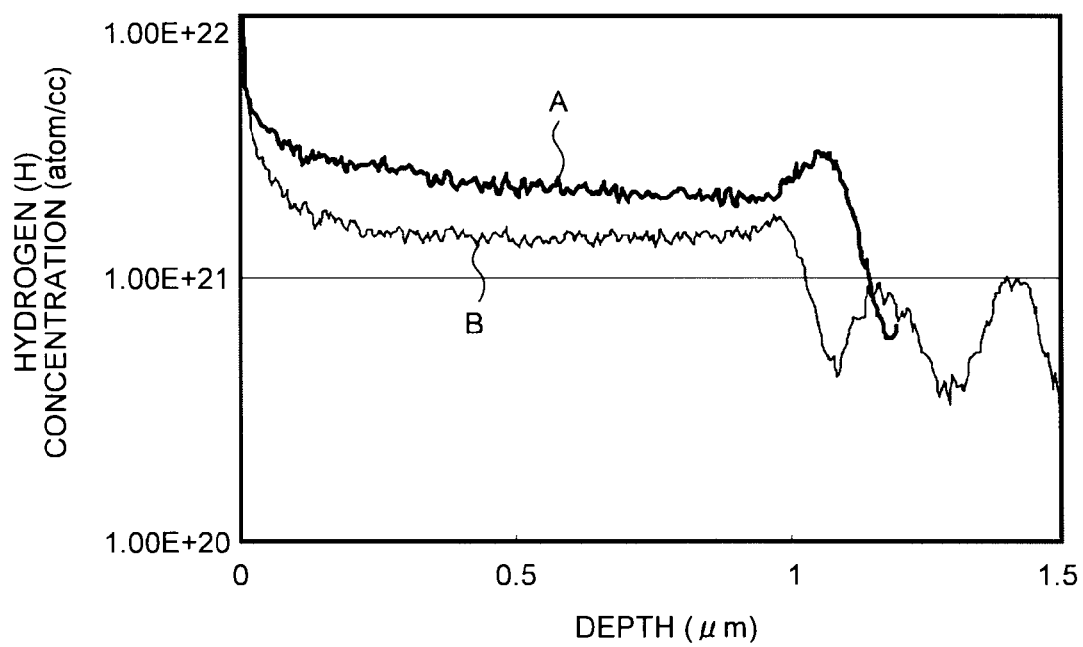
FIG. 6 is a characteristic diagram of an example of a depth-direction profile of a content of hydrogen in a microcrystalline silicon film that is formed by the manufacturing device of a microcrystalline silicon film according to the first embodiment of the present invention.
Figure 7:
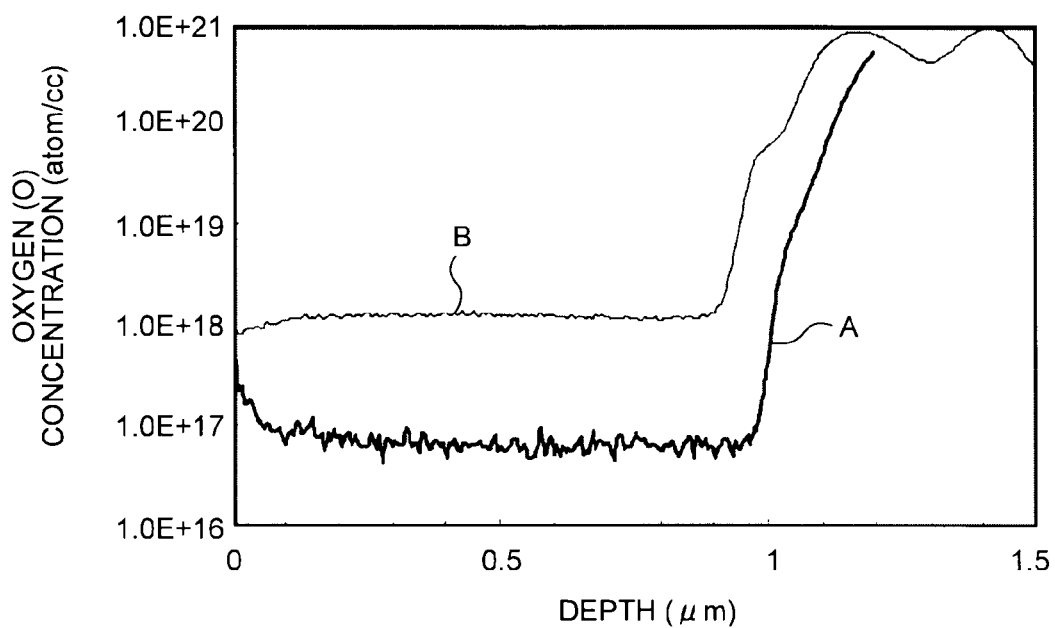
FIG. 7 is a characteristic diagram of an example of a depth-direction profile of a content of oxygen in a microcrystalline silicon film that is formed by the manufacturing device of a microcrystalline silicon film according to the first embodiment of the present invention.
Figure 8:
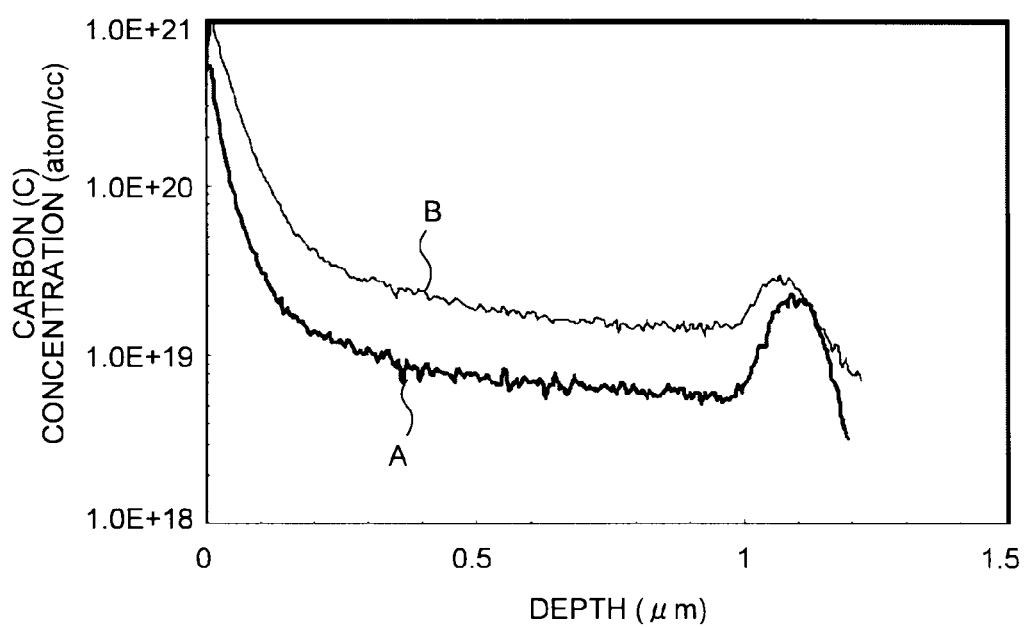
FIG. 8 is a characteristic diagram of an example of a depth-direction profile of a content of carbon in a microcrystalline silicon film that is formed by the manufacturing device of a microcrystalline silicon film according to the first embodiment of the present invention.
Figure 9:
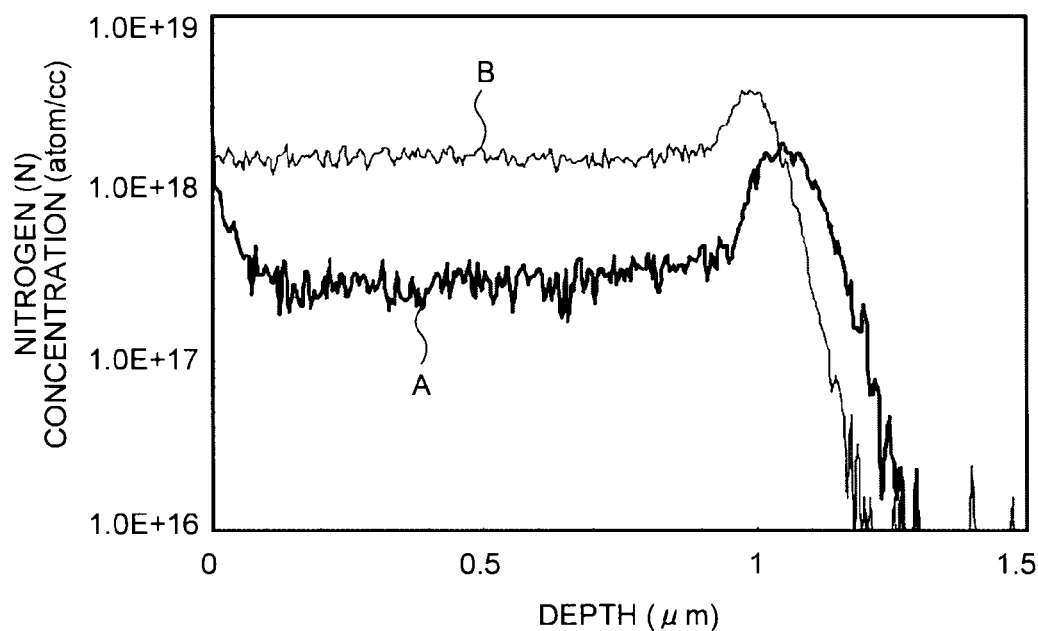
FIG. 9 is a characteristic diagram of an example of a depth-direction profile of a content of nitrogen in a microcrystalline silicon film that is formed by the manufacturing device of a microcrystalline silicon film according to the first embodiment of the present invention.

FIGS. 6 to 9 depict results of SIMS analyses. FIG. 6 is a characteristic diagram of a depth-direction profile of a content of hydrogen (H) in a microcrystalline silicon film that is formed by the manufacturing device of a microcrystalline silicon film according to the first embodiment. FIG. 7 is a characteristic diagram of a depth-direction profile of a content of oxygen (O) in a microcrystalline silicon film that is formed by the manufacturing device of a microcrystalline silicon film according to the first embodiment. FIG. 8 is a characteristic diagram of a depth-direction profile of a content of carbon (C) in a microcrystalline silicon film that is formed by the manufacturing device of a microcrystalline silicon film according to the first embodiment. FIG. 9 is a characteristic diagram of a depth-direction profile of a content of nitrogen (N) in a microcrystalline silicon film that is formed by the manufacturing device of a microcrystalline silicon film according to the first embodiment.

Each of FIGS. 6 to 9 also depicts a result of an SIMS analysis that is performed to a microcrystalline silicon film before a passivation process by hydrogen radicals is performed. In FIGS. 6 to 9, a lateral axis represents a depth (μm) from a surface of the microcrystalline silicon film, and a vertical axis represents an element concentration (atom/cc). In FIGS. 6 to 9, a thick line A represents a result of the SIMS analysis of the microcrystalline silicon film after the passivation process by hydrogen radicals is performed by the manufacturing device of a microcrystalline silicon film. A thin line B represents a result of the SIMS analysis of the microcrystalline silicon film before the passivation process is performed.

In FIG. 6, a concentration of hydrogen (H) shown by the thick line A is higher than that shown by the thin line B in substantially an entire depth direction, and it can be understood that a content of hydrogen (H) in the microcrystalline silicon film increases by the hydrogen passivation process. That is, crystalline grain boundaries are considered to be sufficiently terminated by hydrogen (H) in the microcrystalline silicon film to which a passivation process by hydrogen radicals is performed by the manufacturing device of a microcrystalline silicon film according to the present embodiment.

With reference to FIGS. 7, 8, and 9, all contents of carbon (C), oxygen (O), and nitrogen (N) in the microcrystalline silicon film are reduced by about 0.5 digit to 1.0 digit after a passivation process by hydrogen radicals (the thick line A). It has been confirmed from the result that the passivation process by the manufacturing device of a microcrystalline silicon film according to the present embodiment has an effect of suppressing adsorption of impurities to crystalline grain boundaries of microcrystalline silicon.

Figure 10:
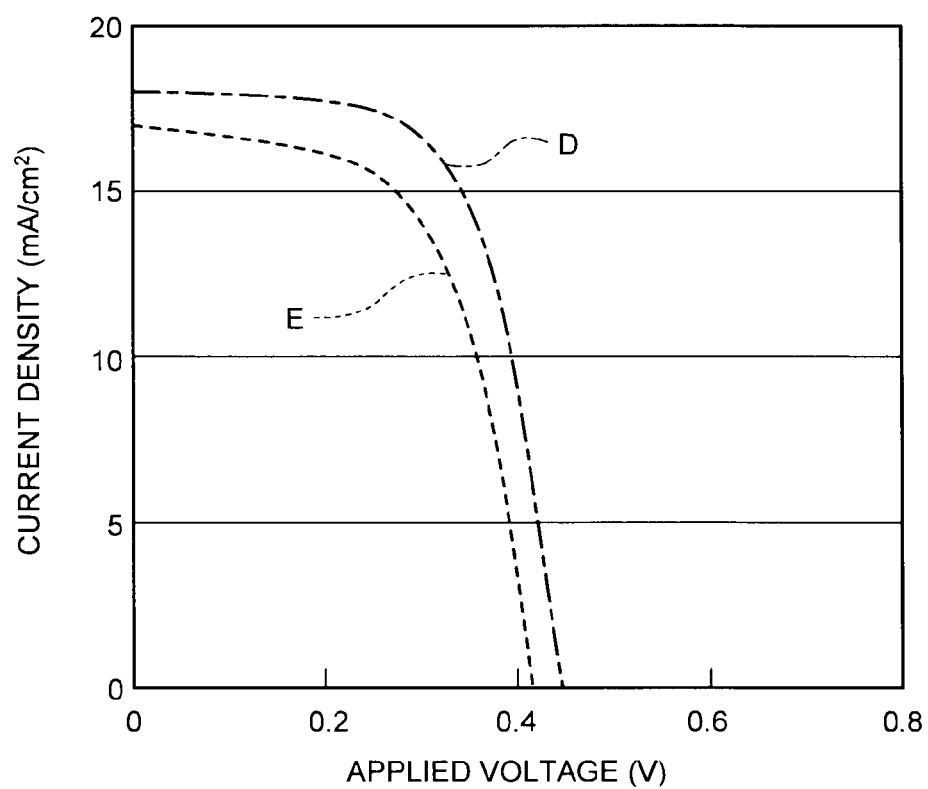
FIG. 10 is a characteristic diagram of an example of an electric property (voltage-current property) of thin-film solar battery cells (microcrystalline silicon cells) of a module having an electric-power generation layer that are formed by using the manufacturing device of a microcrystalline silicon film according to the first embodiment of the present invention.
Figures 1, 11:
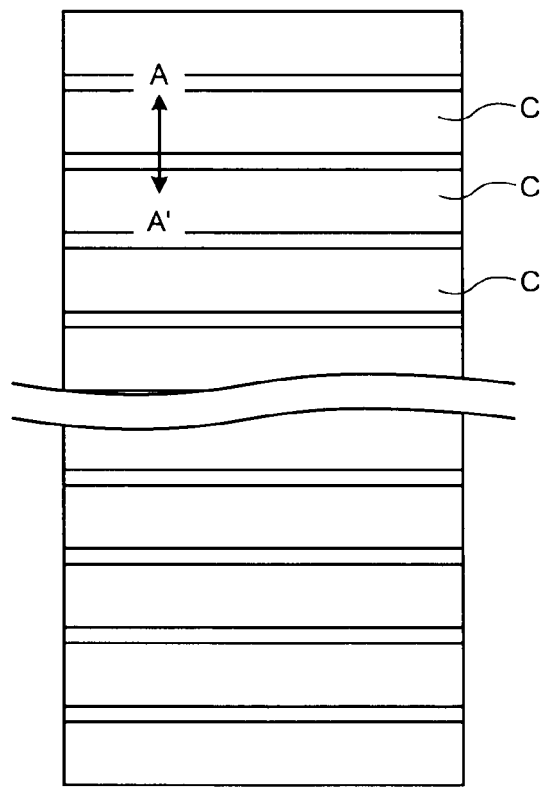
Figures 2, 11:
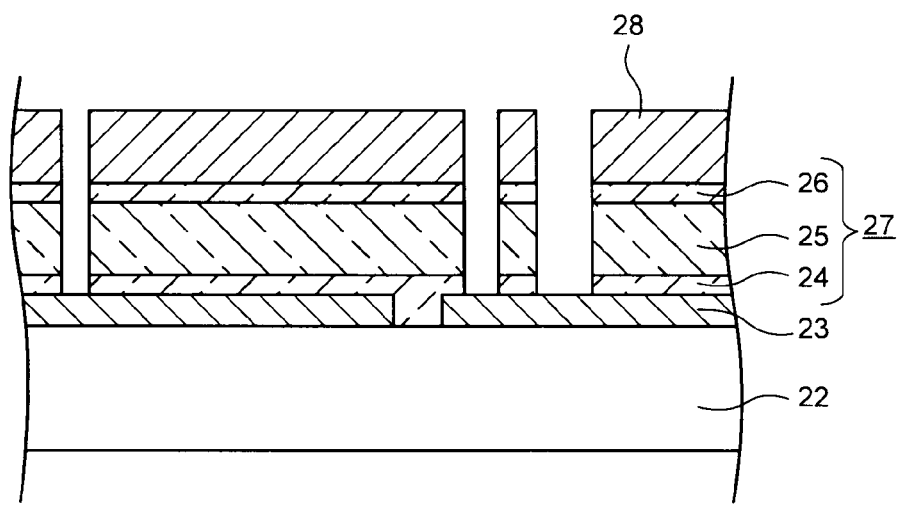

FIG. 10 is a characteristic diagram of an electric property (voltage-current property: IV property) of thin-film solar battery cells (microcrystalline silicon cells) C of a thin-film solar battery module (hereinafter, "module") having an electric-power generation layer formed by performing a passivation process by hydrogen radicals by using the manufacturing device of a microcrystalline silicon film according to the first embodiment. FIG. 11-1 is a plan view of a schematic configuration of a module 21. FIG. 11-2 is an explanatory diagram of a cross-sectional structure of the thin-film solar battery cells (microcrystalline silicon cells) C, and is a cross-sectional view of relevant parts along a line A-A' in FIG. 11-1.

As shown in FIGS. 11-1 and 11-2, the module 21 according to an example has plural thin-film solar battery cells (microcrystalline silicon cells) C of a reed shape (rectangular shape) that are formed on a translucent insulating substrate 22, and has a structure that adjacent thin-film solar battery cells (microcrystalline silicon cells) C are electrically connected in series. The thin-film solar battery cells (microcrystalline silicon cells) C have a structure that a transparent electrode layer 23 as a first electrode layer, a photoelectric conversion layer 27, and a back-surface electrode layer 28 as a second electrode layer made of a conductive film that reflects light are sequentially stacked on the translucent insulating substrate 22.

The photoelectric conversion layer 27 is made of a microcrystalline silicon film having a PIN junction, and includes a P-type microcrystalline silicon film (μc-Si film) 24 as a P-type microcrystalline semiconductor layer that is a first conductive semiconductor layer, an I-type microcrystalline silicon film (μc-Si film) 25 as an I-type microcrystalline semiconductor layer that is a second conductive semiconductor layer, and an N-type microcrystalline silicon film (μc-Si film) 26 as an N-type microcrystalline semiconductor layer that is a third conductive semiconductor layer, from a side of the transparent electrode layer 23 as shown in FIG. 11-2. The I-type microcrystalline silicon film (μc-Si film) 25 is performed with a passivation process by hydrogen radicals by using the manufacturing device of a microcrystalline silicon film according to the first embodiment.

As an example, the module 21 is manufactured as follows. First, the transparent electrode layer 23 as a first electrode layer is formed on the translucent insulating substrate 22. The transparent electrode layer 23 is patterned by performing a laser scribe at a back-surface side of the translucent insulating substrate 22 (at a side not formed with the transparent electrode layer 23) such that openings reaching the surface of the translucent insulating substrate 22 are formed.

Next, the P-type microcrystalline silicon film (μc-Si film) 24, the I-type microcrystalline silicon film (μc-Si film) 25, and the N-type microcrystalline silicon film (μc-Si film) 26 are deposited in this order, thereby forming the photoelectric conversion layer 27 having a P-I-N junction. When the I-type microcrystalline silicon film (μc-Si film) 25 is formed, the manufacturing device of a microcrystalline silicon film according to the first embodiment forms the film, and performs a passivation process by hydrogen radicals. The photoelectric conversion layer 27 is patterned by performing a laser scribe at the back-surface side of the translucent insulating substrate 22 such that openings reaching the surface of the transparent electrode layer 23 are formed.

Thereafter, the back-surface electrode layer 28 as a second electrode layer is formed. The back-surface electrode layer 28 is laser-scribed at the back-surface side of the translucent insulating substrate 22 such that openings that reach a surface of the back-surface electrode layer 28 are formed through the photoelectric conversion layer 27, thereby forming the plural thin-film solar battery cells (microcrystalline silicon cells) C.

As a comparative example, FIG. 10 depicts the electric property (voltage-current property: IV property) of the thin-film solar battery cells (microcrystalline silicon cells) C of a module 31 manufactured without performing a hydrogen passivation process to the I-type microcrystalline silicon film (μc-Si film) 25. The module 31 has the same configuration as that of the module 21, except that a hydrogen passivation process is not performed to the I-type microcrystalline silicon film 25.

In FIG. 10, a chain line D represents an IV property of the module 21 (the example) that a hydrogen passivation process is performed after the I-type microcrystalline silicon film 25 is formed. A dotted line E represents an IV property of the module 31 (the comparative example) that a hydrogen passivation process is not performed to the I-type microcrystalline silicon film 25. As is clear from FIG. 10, the module 21 (the example) that a hydrogen passivation process is performed after forming the I-type microcrystalline silicon film 25 has an increased short-circuit current density and an increased open circuit voltage.

Table 1 shows power generation efficiency (%), a short-circuit current density ($mA/cm^2$), an open circuit voltage (V), and a fill factor, in the example (the module 21) and the comparative example (the module 31), respectively.

TABLE 1

|  | Example | Comparative example |
|---|---|---|
| Power generation efficiency (%) | 5.5 | 4.0 |
| Short-circuit current density ($mA/cm^2$) | 18.0 | 17.0 |
| Open circuit voltage (V) | 0.44 | 0.40 |
| Fill factor | 0.69 | 0.69 |

It is clear from a result shown in Table 1 that all properties of the short-circuit current density ($mA/cm^2$), the open circuit voltage (V), and the fill factor increase by about 10% by performing a hydrogen passivation process to the I-type microcrystalline silicon film 25 by using the manufacturing device of a microcrystalline silicon film according to the first embodiment. As a result, power generation efficiency increases by about 1.5 times. As explained above, it is clear that the hydrogen passivation process to the I-type microcrystalline silicon film 25 by using the manufacturing device of a microcrystalline silicon film according to the first embodiment has an effect of improving power generation efficiency in the microcrystalline silicon, thin film solar battery cell.

Figure 12:
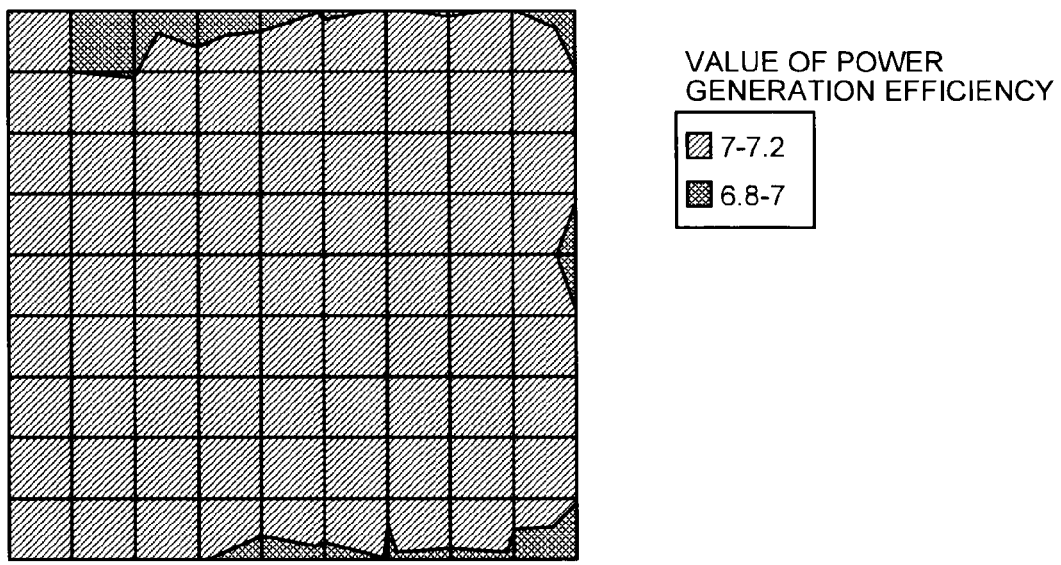
FIG. 12 is a characteristic diagram of an in-plane distribution of power generation efficiency of thin-film solar battery cells (microcrystalline silicon cells) of which an electric-power generation layer is manufactured by using the manufacturing device of a microcrystalline silicon film according to the first embodiment of the present invention.

FIG. 12 is a characteristic diagram of an in-plane distribution of power generation efficiency (%) of thin-film solar battery cells (microcrystalline silicon cells) of which an electric-power generation layer is manufactured by using the manufacturing device of a microcrystalline silicon film according to the first embodiment on a transparent electrode substrate having a 100×100-mm size. FIG. 12 depicts an in-plane distribution of a measurement result of power generation efficiency (%) by manufacturing 81 microcrystalline silicon cells in total on a transparent electrode substrate. Thin-film solar battery cells (microcrystalline silicon cells) positioned at an external periphery are used for connecting electrodes. Therefore, the substantive number of measurement cells is 64.

The thin-film solar battery cells (microcrystalline silicon cells) are structured such that the transparent electrode layer 23 as a first electrode layer, the photoelectric conversion layer 27, and the back-surface electrode layer 28 as a second electrode layer are sequentially stacked on the translucent insulating substrate 22, in a manner similar to that in FIG. 11-2. The electric-power generation layer includes the P-type microcrystalline silicon film (μc-Si film) 24 as a P-type microcrystalline semiconductor layer that is a first conductive semiconductor layer, the I-type microcrystalline silicon film (μc-Si film) 25 as an I-type microcrystalline semiconductor layer that is a second conductive semiconductor layer, and the N-type microcrystalline silicon film (μc-Si film) 26 as an N-type microcrystalline semiconductor layer that is a third conductive semiconductor layer, from a side of the transparent electrode layer 23 on the translucent insulating substrate 22, in a manner similar to that in FIG. 11-2. A hydrogen passivation process is performed to the I-type microcrystalline silicon film (μc-Si film) 25 by using the manufacturing device of the microcrystalline silicon film according to the first embodiment.

Figure 13:
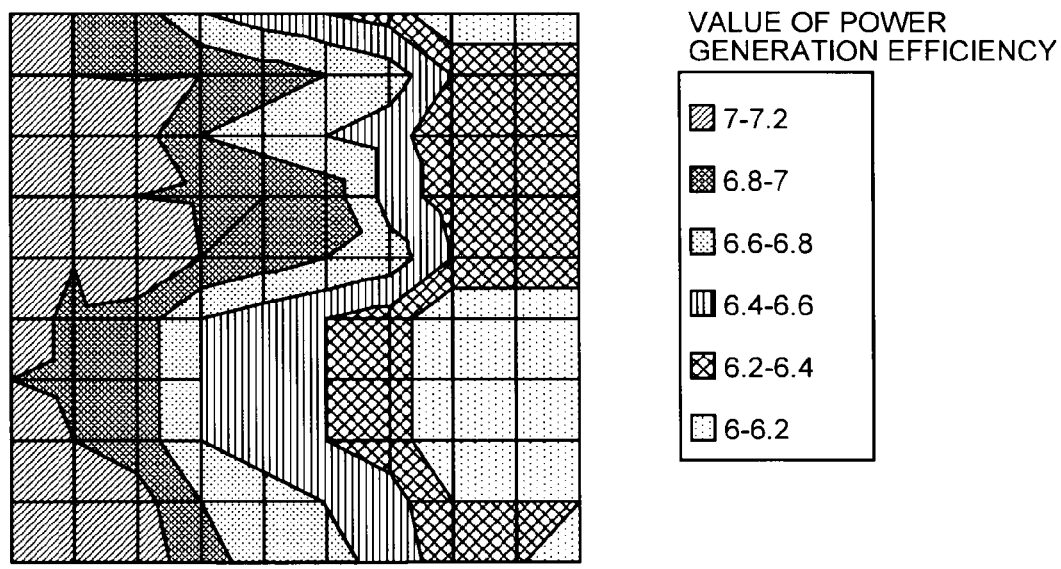
FIG. 13 is a characteristic diagram of an in-plane distribution of power generation efficiency of thin-film solar battery cells (microcrystalline silicon cells) that are manufactured by using a thin-film manufacturing device according to a conventional example.

FIG. 13 is a characteristic diagram of an in-plane distribution of power generation efficiency of thin-film solar battery cells (microcrystalline silicon cells) that are manufactured by using a thin-film manufacturing device according to the conventional example (Patent Literature 2), that is, a thin-film manufacturing device having a hydrogen-radical generation chamber provided at a side of the film forming chamber.

It is clear from FIG. 12 that power generation efficiency (%) of 64 thin-film solar battery cells (microcrystalline silicon cells) on the transparent electrode substrate is all within a range of about 7% to 7.2%, and that ±5% of an in-plane distribution is obtained. On the other hand, it is clear from FIG. 12 that power generation efficiency (%) represents an in-plane distribution of gradually decreasing in a direction from right to left in the characteristic diagram. This reflects a deviation of a supply quantity of hydrogen radicals to a surface of the microcrystalline silicon film. An in-plane distribution of power generation efficiency in FIG. 13 is ±15%, which is inferior to an in-plane distribution of cells in the first embodiment by about three times. That is, the in-plane distribution of power generation efficiency can be improved by about three times of a conventional in-plane distribution, by performing a hydrogen passivation process to the I-type microcrystalline silicon film 25 by using the manufacturing device of a microcrystalline silicon film according to the first embodiment. As explained above, it is clear that higher power-generation efficiency can be achieved in a more satisfactory in-plane distribution as compared with conventional techniques, when thin-film solar battery cells (microcrystalline silicon cells) are manufactured by using the manufacturing device of a microcrystalline silicon film according to the first embodiment.

As described above, the manufacturing device of a microcrystalline silicon film according to the first embodiment has the radical generation chamber 8 set at an opposite side of the shower head 5 relative to the substrate stage 1, and includes an openable and closable shutter between the shower head 5 and the radical generation chamber 8. Therefore, hydrogen radicals generated in the radical generation chamber 8 can be supplied to an entire surface of a film forming surface via the shower head 5 after film formation. Because radicals can be supplied via the shower head 5, an excellent uniform process can be performed even when the size of the radical generation chamber 8 is smaller than those of the shower head 5 and the substrate stage 1 when the radicals are diffused in the shower head 5. In the first embodiment, the radical generation chamber 8 having a larger size than that of the translucent insulating substrate 2 is adjacently provided in a region that is superimposed with an entire surface of the translucent insulating substrate 2 as an upper part of the film forming chamber 4. Hydrogen radicals are supplied from the bottom surface of the radical generation chamber 8 to the microcrystalline silicon film. Therefore, a passivation process can be performed by hydrogen radicals by uniformly supplying the hydrogen radicals to an entire surface of the microcrystalline silicon film while preventing damage and defects of the microcrystalline silicon film.

The manufacturing device of a microcrystalline silicon film according to the first embodiment performs a passivation process by hydrogen radicals without exposing a microcrystalline silicon film to ambient air after forming the microcrystalline silicon film. Therefore, adsorption of impurities (oxygen, nitrogen, carbon) to crystalline grain boundaries of the microcrystalline silicon film can be suppressed.

The manufacturing device of a microcrystalline silicon film according to the first embodiment generates hydrogen radicals by dissociating hydrogen gas by the microwave plasma 14 in the radical generation chamber 8. Therefore, a high-density plasma is generated in the radical generation chamber 8, and high-density hydrogen radicals can be generated. As a result, a supply quantity of hydrogen radicals increases by one digit or more than that of a conventional example, and a hydrogen passivation effect can be obtained more effectively.

According to the method for manufacturing a microcrystalline silicon film of the first embodiment, when the manufacturing device of a microcrystalline silicon film according to the first embodiment is used for manufacturing an I-type microcrystalline silicon film for an electric power layer of a thin film solar battery cell formed by stacking a microcrystalline silicon film, crystalline grain boundaries of the I-type microcrystalline silicon film that is oriented in the (111) plane can be uniformly passivated by hydrogen radicals in the plane of the microcrystalline silicon film. As a result, a uniform hydrogen passivation effect can be obtained on an entire surface of the microcrystalline silicon film, and adsorption of impurities (oxygen, nitrogen, carbon) to crystalline grain boundaries of the I-type microcrystalline silicon film can be suppressed. Because an in-plane distribution of satisfactory power-generation efficiency can be achieved by performing a uniform hydrogen passivation to an entire surface of the microcrystalline silicon film, a reduction in the yield of a thin-film solar cell attributable to an in-plane distribution defect can be prevented, and the yield of a thin-film solar cell can be improved.

Because a passivation process can be performed by hydrogen radicals without exposing an I-type microcrystalline silicon film to ambient air after forming the microcrystalline silicon film, adsorption of impurities (oxygen, nitrogen, carbon) to crystalline grain boundaries of the I-type microcrystalline silicon film can be suppressed. As a result, a thin-film solar cell having satisfactory power-generation efficiency can be manufactured.

When the manufacturing device of a microcrystalline silicon film according to the first embodiment is used, satisfactory power generation efficiency can be achieved in a satisfactory in-plane distribution even on a large-area glass substrate (1.1×1.4 meters) that is generally used in mass production of thin-film solar cells.

Although a single-cell thin-film solar cell having only one photoelectric-conversion layer is explained above as an example, the present invention can be also applied to a tandem thin-film solar cell having plural photoelectric-conversion layers stacked together. In this case, the effect of the present invention becomes significant when the number of stacked photoelectric-conversion layers (electric-power generation layers) is larger.

Second Embodiment

Figure 14:
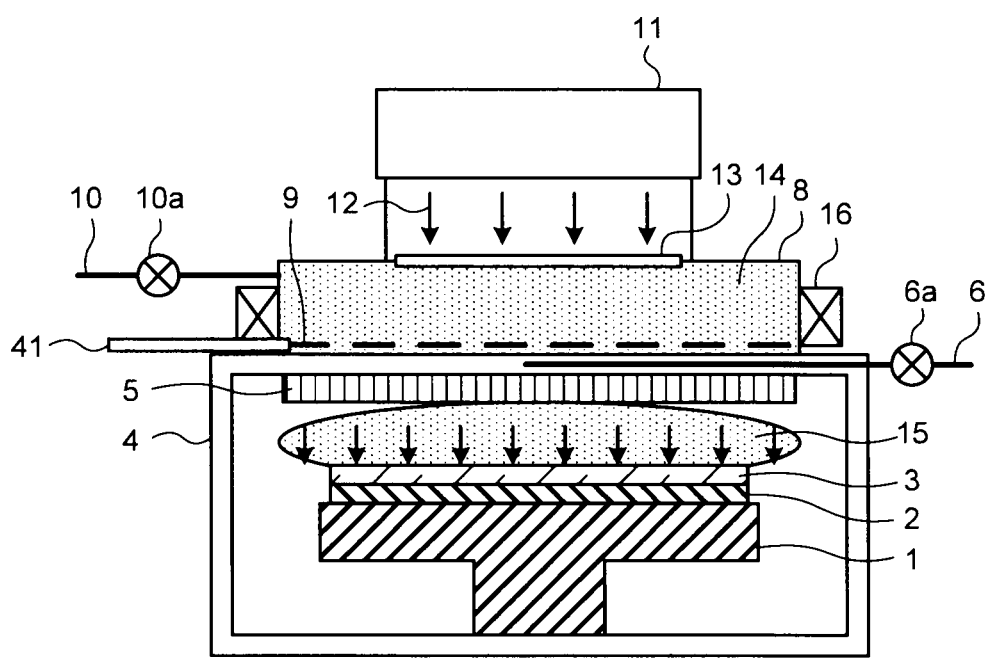
FIG. 14 is a schematic diagram of a cross-sectional structure of a manufacturing device of a microcrystalline silicon film according to a second embodiment of the present invention.

FIG. 14 is a schematic diagram of a cross-sectional structure of a manufacturing device of a microcrystalline silicon film according to a second embodiment. FIG. 14 depicts a state that the manufacturing device of a microcrystalline silicon film forms a microcrystalline silicon film. The manufacturing device of a microcrystalline silicon film according to the second embodiment has an additional function that applies a negative direct-current bias voltage to the shutter 9 in the manufacturing device of a microcrystalline silicon film according to the first embodiment shown in FIG. 1. That is, in the manufacturing device of a microcrystalline silicon film according to the first embodiment, a wiring 41 for applying a bias voltage is connected to the shutter 9, as a bias-voltage applying unit that applies a negative direct-current bias voltage to the shutter 9.

Figure 15:
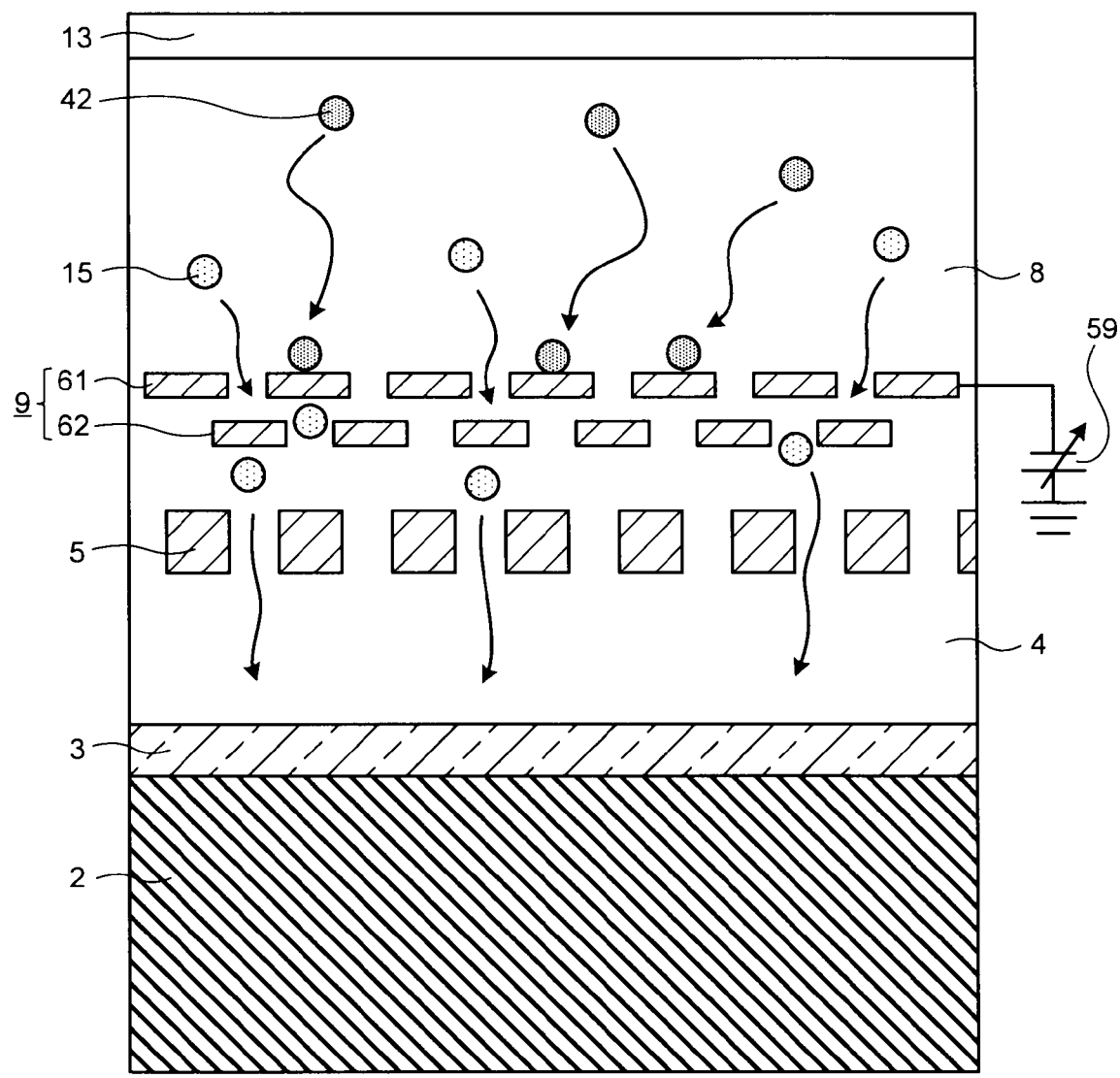
FIG. 15 is a schematic diagram of a behavior of hydrogen radicals and hydrogen ions in a hydrogen passivation process by the manufacturing device of a microcrystalline silicon film according to the second embodiment of the present invention.

FIG. 15 is a schematic diagram of a behavior of the hydrogen radicals 15 and hydrogen ions 42 in the radical generation chamber 8 and in the film forming chamber 4 when the manufacturing device of a microcrystalline silicon film according to the second embodiment performs a hydrogen passivation process to the microcrystalline silicon film 3 formed on the translucent insulating substrate 2. A negative direct-current bias voltage is applied to the shutter 9 from a direct-current-bias-application power source 59 to the shutter 9.

As described above, the radical generation chamber 8 and the film forming chamber 4 are connected to each other via the openable and closable shutter 9 on which plural holes are provided. Hydrogen radicals are introduced into the film forming chamber 4 through the holes of the shutter 9. The hydrogen ions 42 generated in the radical generation chamber 8 have positive electric charges, and the shutter 9 is applied with a negative-direct-current bias voltage by the wiring 41 for applying a bias voltage. Therefore, substantially the whole of the hydrogen ions 42 generated in the radical generation chamber 8 are adsorbed and trapped by a coulomb force by the shutter 9 that is applied with a negative-direct-current bias voltage as shown in FIG. 14, and the hydrogen ions 42 cannot enter the film forming chamber 4. As a result, mixing of the hydrogen ions 42 into the film forming chamber 4 is suppressed, and ion damage to the microcrystalline silicon film 3 by the hydrogen ions 42 can be suppressed and prevented.

Meanwhile, all the hydrogen radicals 15 that are electrically neutral are introduced in the film forming chamber 4 via the shower head 5 through the holes of the shutter 9, and are supplied to the microcrystalline silicon film 3. In this case, ion damage to the microcrystalline silicon film 3 by the hydrogen ions 42 becomes greater.

Figure 16:
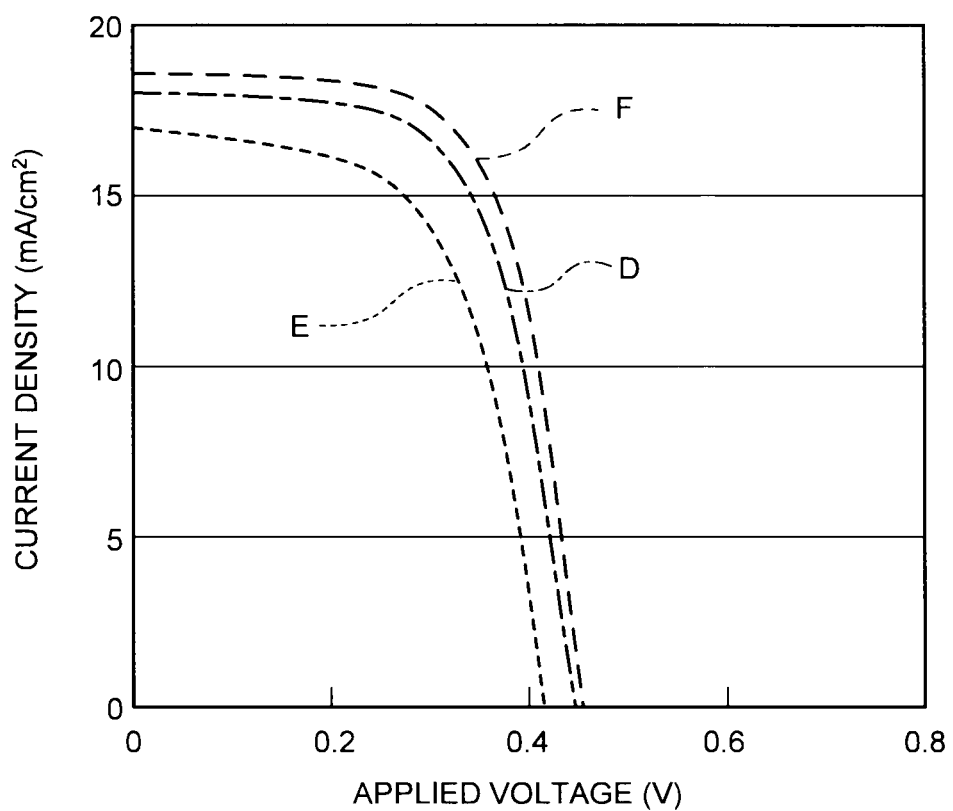
FIG. 16 is a characteristic diagram of an example of an electric property (voltage-current property) of thin-film solar battery cells (microcrystalline silicon cells) of a module having an electric-power generation layer that are formed by using the manufacturing device of a microcrystalline silicon film according to the second embodiment of the present invention.

FIG. 16 is a characteristic diagram of an electric property (voltage-current property: IV property) of thin-film solar battery cells (microcrystalline silicon cells) of a module according to the second embodiment. The thin-film solar battery cells (microcrystalline silicon cells) according to the second embodiment have an electric-power generation layer (I-type microcrystalline semiconductor layer) formed by performing a passivation process by hydrogen radicals by using the manufacturing device of a microcrystalline silicon film according to the second embodiment. In FIG. 16, a dotted line F represents an IV property of the thin-film solar battery cells (microcrystalline silicon cells) according to the second embodiment. A module according to the second embodiment has the same configuration as that of the module 21. FIG. 16 depicts both IV properties (FIG. 10) of the module 21 and the module 31.

As is clear from FIG. 16, a short-circuit current density (power generation current) shown by the dotted line F is larger than that shown by a chain line D, and power generation efficiency increases. As explained above, when the manufacturing device of a microcrystalline silicon film according to the second embodiment generates the electric-power generation layer (I-type microcrystalline semiconductor layer), it is clear that ion damage on the microcrystalline silicon film by the hydrogen ions can be suppressed and that a thin-film solar cell having higher power-generation efficiency than that manufactured by a conventional device can be manufactured.

As described above, according to the manufacturing device of a microcrystalline silicon film according to the second embodiment, the shutter 9 can trap the hydrogen ions 42 generated by the radical generation chamber 8 and prevent the mixing of the hydrogen ions 42 into the film forming chamber 4, and can suppress ion damage on the microcrystalline silicon film 3 by the hydrogen ions 42, by applying a negative-direct-current bias voltage to the shutter 9. When an electric-power generation layer (I-type microcrystalline semiconductor layer) is manufactured by using the manufacturing device of a microcrystalline silicon film according to the second embodiment, a thin-film solar cell having higher power-generation efficiency can be manufactured.

Third Embodiment

Figures 1, 17:
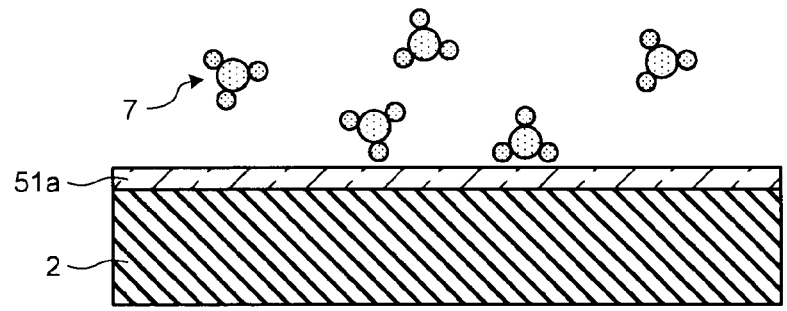
Figures 2, 17:
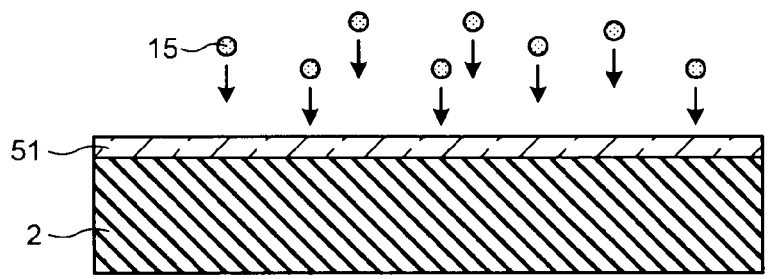
Figures 3, 17:
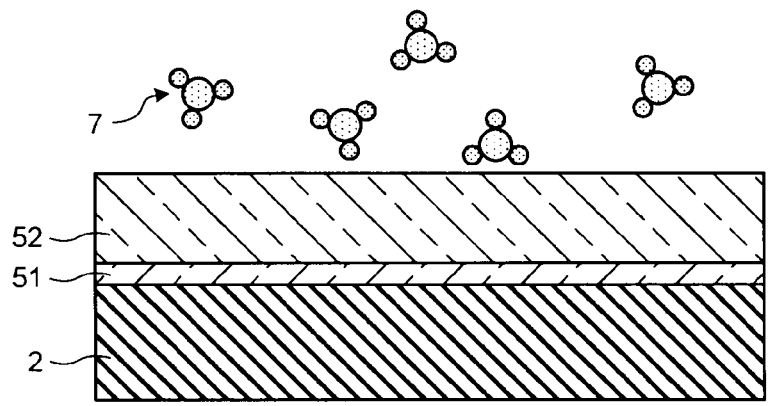
Figures 4, 17:
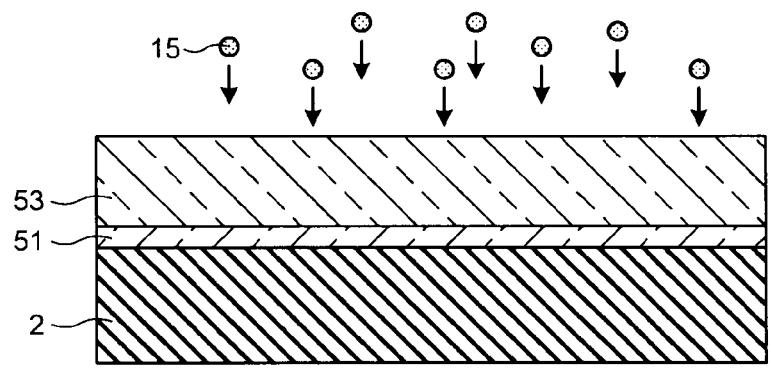

FIGS. 17-1 to 17-4 are schematic diagrams for explaining a method for manufacturing a microcrystalline silicon film according to a third embodiment. In the method for manufacturing a microcrystalline silicon film according to the third embodiment, a case of using the manufacturing device of a microcrystalline silicon film according to the first embodiment is explained.

First, as shown in FIG. 17-1, the manufacturing device of a microcrystalline silicon film according to the first embodiment forms a microcrystalline-silicon initial film 51a by supplying the film forming precursor 7 onto the translucent insulating substrate 2. According to a film forming process in the third embodiment, formation of a microcrystalline silicon film temporarily stops at a time corresponding to 20% of the total film forming time.

Next, after a temporary stop of film formation, the shutter 9 is opened, and the hydrogen radicals 15 generated in the radical generation chamber 8 are introduced into the film forming chamber 4. The hydrogen radicals 15 are supplied onto the microcrystalline-silicon initial film 51a as shown in FIG. 17-2, thereby performing a hydrogen passivation process, and forming a microcrystalline-silicon initial film 51 having a hydrogen passivation process performed thereon. In this case, the hydrogen radicals 15 are uniformly supplied to an entire surface of the microcrystalline-silicon initial film 51a. Therefore, crystalline grain boundaries can be uniformly passivated by the hydrogen radicals 15 on the entire surface of the microcrystalline silicon film. Thereafter, the shutter 9 is closed, and the hydrogen passivation process is interrupted.

Although a hydrogen passivation process is performed at a time corresponding to 20% of the total film forming time of a microcrystalline silicon film in the present embodiment, the process can be performed by once interrupting the film formation at an initial stage of forming a film of microcrystalline silicon, for example, at a stage of about 10% to 20% of the total film forming time. When the hydrogen passivation process is performed at the initial stage of film formation, a passivation effect by the hydrogen radicals 15 can penetrate around the translucent insulating substrate 2 deep in the microcrystalline silicon film.

Next, film formation is restarted, and a microcrystalline silicon bulk 52 is formed as shown in FIG. 17-3 by supplying the film forming precursor 7 onto the microcrystalline silicon initial film 51. After the film formation is finished completely, the shutter 9 is opened again, the hydrogen radicals 15 are supplied to the film forming chamber 4, and the hydrogen radicals 15 are supplied onto the microcrystalline silicon bulk 52, thereby performing a passivation process. With this configuration, a microcrystalline silicon bulk 53 having a hydrogen passivation process performed thereon is formed as shown in FIG. 17-4.

As explained above, according to the method for manufacturing a microcrystalline silicon film according to the third embodiment, there is a process of once performing a hydrogen passivation process at a stage where the microcrystalline-silicon initial film 51a is formed. With this arrangement, a hydrogen passivation effect can penetrate around the translucent insulating substrate 2 deep in the microcrystalline silicon film.

Figure 18:
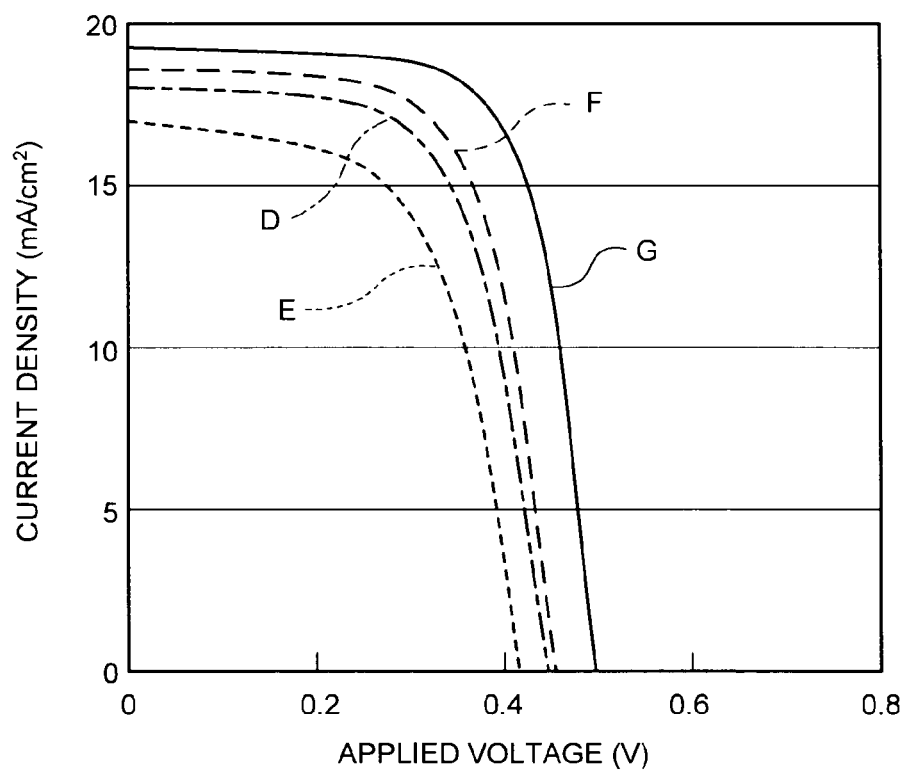
FIG. 18 is a characteristic diagram of an example of an electric property (voltage-current property) of thin-film solar battery cells (microcrystalline silicon cells) of a module according to the third embodiment of the present invention.

FIG. 18 is a characteristic diagram of an electric property (voltage-current property: IV property) of thin-film solar battery cells (microcrystalline silicon cells) of a module according to the third embodiment. The thin-film solar battery cells (microcrystalline silicon cells) according to the third embodiment have an electric-power generation layer (I-type microcrystalline silicon film ($\mu$c-Si film)) that is formed by performing a passivation process by hydrogen radicals by the method for manufacturing a microcrystalline silicon film according to the third embodiment. In FIG. 18, a solid line G represents an IV property of thin-film solar battery cells (microcrystalline silicon cells) according to the third embodiment. A module according to the third embodiment has the same configuration as that of the module 21. FIG. 18 also depicts both the IV property (a chain line D) of the module 21 according to the first embodiment and the IV property (a dotted line F) of the module according to the second embodiment.

As is clear from FIG. 18, the solid ling G represents a larger short-circuit current density and a larger open circuit voltage than those of the chain line D and the dotted line F. In the thin-film solar battery cells (microcrystalline silicon cells) according to the third embodiment, power generation efficiency increases more than those in the first and second embodiments. As explained above, a passivation effect by the hydrogen radicals 15 can penetrate around the substrate deep in the microcrystalline silicon film, by once performing a hydrogen passivation process to the microcrystalline-silicon initial film 51a after forming the microcrystalline-silicon initial film 51a and by further performing again a hydrogen passivation process after forming the microcrystalline silicon bulk 52. Consequently, a thin-film solar cell having higher power-generation efficiency can be manufactured.

Although a case of using the manufacturing device of a microcrystalline silicon film according to the first embodiment has been explained above, a microcrystalline silicon film can be also manufactured in a similar process when the manufacturing device of a microcrystalline silicon film according to the second embodiment is used.

As described above, according to the method for manufacturing a microcrystalline silicon film according to the third embodiment, a hydrogen passivation process is once performed to the microcrystalline-silicon initial film 51a after forming the microcrystalline-silicon initial film 51a, and a hydrogen passivation process is further performed after forming the microcrystalline silicon bulk 52. With this arrangement, a hydrogen passivation effect can sufficiently penetrate deep into the microcrystalline silicon film (around the translucent insulating substrate 2). When the method for manufacturing a microcrystalline silicon film according to the third embodiment is used to form an I-type microcrystalline silicon film of a thin-film solar cell having a stacked microcrystalline silicon film, an I-type microcrystalline silicon film sufficiently performed with a hydrogen passivation process deep into the microcrystalline silicon film (around the translucent insulating substrate 2) can be manufactured. As a result, a thin-film solar cell having higher power-generation efficiency can be achieved.

Fourth Embodiment

Figure 19:
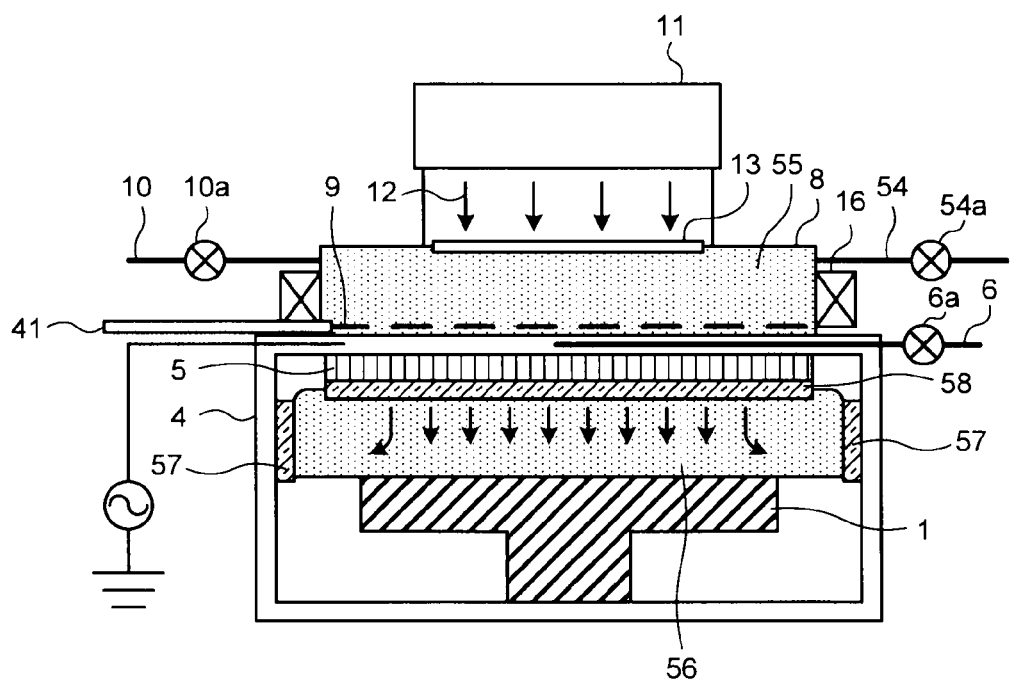
FIG. 19 is a schematic diagram for explaining a method for cleaning a film forming chamber by a manufacturing device of a microcrystalline silicon film according to a fourth embodiment of the present invention.

FIG. 19 is a schematic diagram for explaining a method for cleaning a film forming chamber by a manufacturing device of a microcrystalline silicon film according to a fourth embodiment of the present invention, and is a schematic diagram of a cross-sectional structure of the manufacturing device of a microcrystalline silicon film according to the fourth embodiment. FIG. 19 depicts a state of cleaning the film forming chamber 4 by the manufacturing device of a microcrystalline silicon film according to the fourth embodiment. The manufacturing device of a microcrystalline silicon film according to the fourth embodiment has an additional function that performs cleaning of an internal wall and the shower head 5 of the film forming chamber 4 in the manufacturing device of a microcrystalline silicon film according to the second embodiment shown in FIG. 14.

When a microcrystalline silicon film is manufactured by the manufacturing method according to the third embodiment, as shown in FIG. 19, a residual film (silicon film) 57 with a thickness of several micrometers and a residual film (silicon film) 58 are adhered on a internal wall of the film forming chamber 4 and a surface of the shower head 5 respectively. In the present embodiment, when the silicon films 57 and 58 are removed, cleaning gas is introduced into the radical generation chamber 8 through a cleaning-gas supply pipe 54 in a state that the shutter 9 is closed, and a cleaning gas plasma 55 is generated by the microwave 12. The cleaning gas is dissociated by the cleaning gas plasma 55, and radicals of the cleaning gas are generated. Thereafter, the shutter 9 is opened, and the radicals of the cleaning gas are introduced into the film forming chamber 4 via the shower head 5. The remaining films adhered on the inside of the film forming chamber 4 are removed by the radicals of the cleaning gas. The quantity of the cleaning gas supplied to the inside of the radical generation chamber 8 can be adjusted by a valve 54a that is attached to the cleaning-gas supply pipe 54.

Generally, carbon tetrafluoride gas, nitrogen trifluoride gas, and sulphur hexafluoride gas are used for the cleaning gas. Fluorine-atom radicals 56 are included in the cleaning gas plasma. The fluorine-atom radicals 56 are introduced into the film forming chamber 4 by opening the shutter 9. A cleaning process is performed by etching the silicon films 57 and 58.

Figure 20:
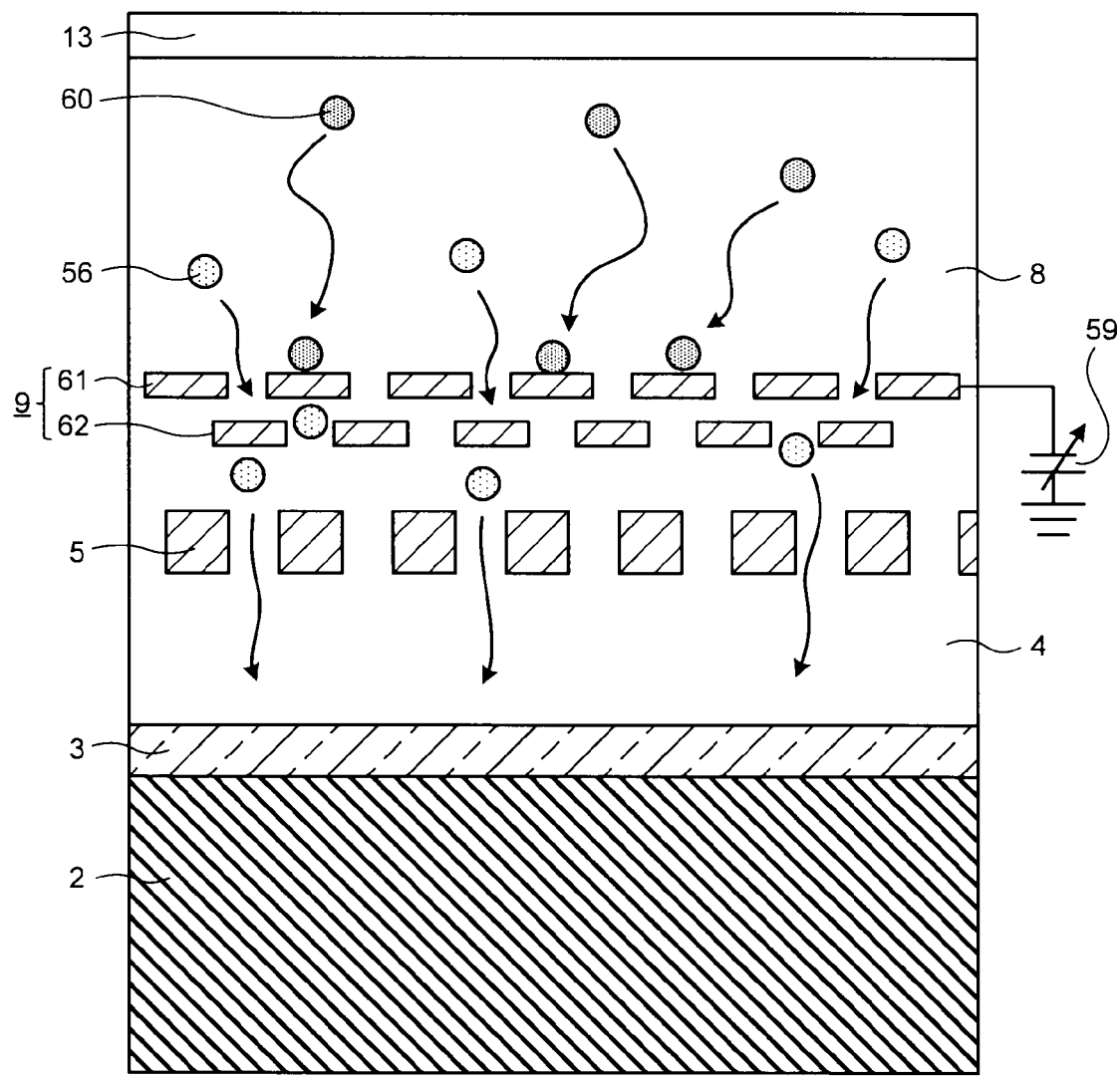
FIG. 20 is a schematic diagram of a behavior of fluorine-atom radicals and cleaning gas ions in a cleaning process by the manufacturing device of a microcrystalline silicon film according to the fourth embodiment of the present invention.

FIG. 20 is a schematic diagram of a behavior of the fluorine-atom radicals 56 and cleaning gas ions 60 in the radical generation chamber 8 and the film forming chamber 4 when the manufacturing device of a microcrystalline silicon film according to the fourth embodiment performs a cleaning process. A negative direct-current bias voltage is applied to the shutter 9 from the direct-current-bias-application power source 59 to the shutter 9 by the wiring 41 for applying a bias voltage, thereby capturing ionic species (the cleaning gas ion 60) that are present in the cleaning gas plasma 55. Ion damage on the internal wall of the film forming chamber 4 is suppressed by introducing only electrically neutral radicals (the fluorine-atom radicals 56) into the film forming chamber 4.

Figure 21:
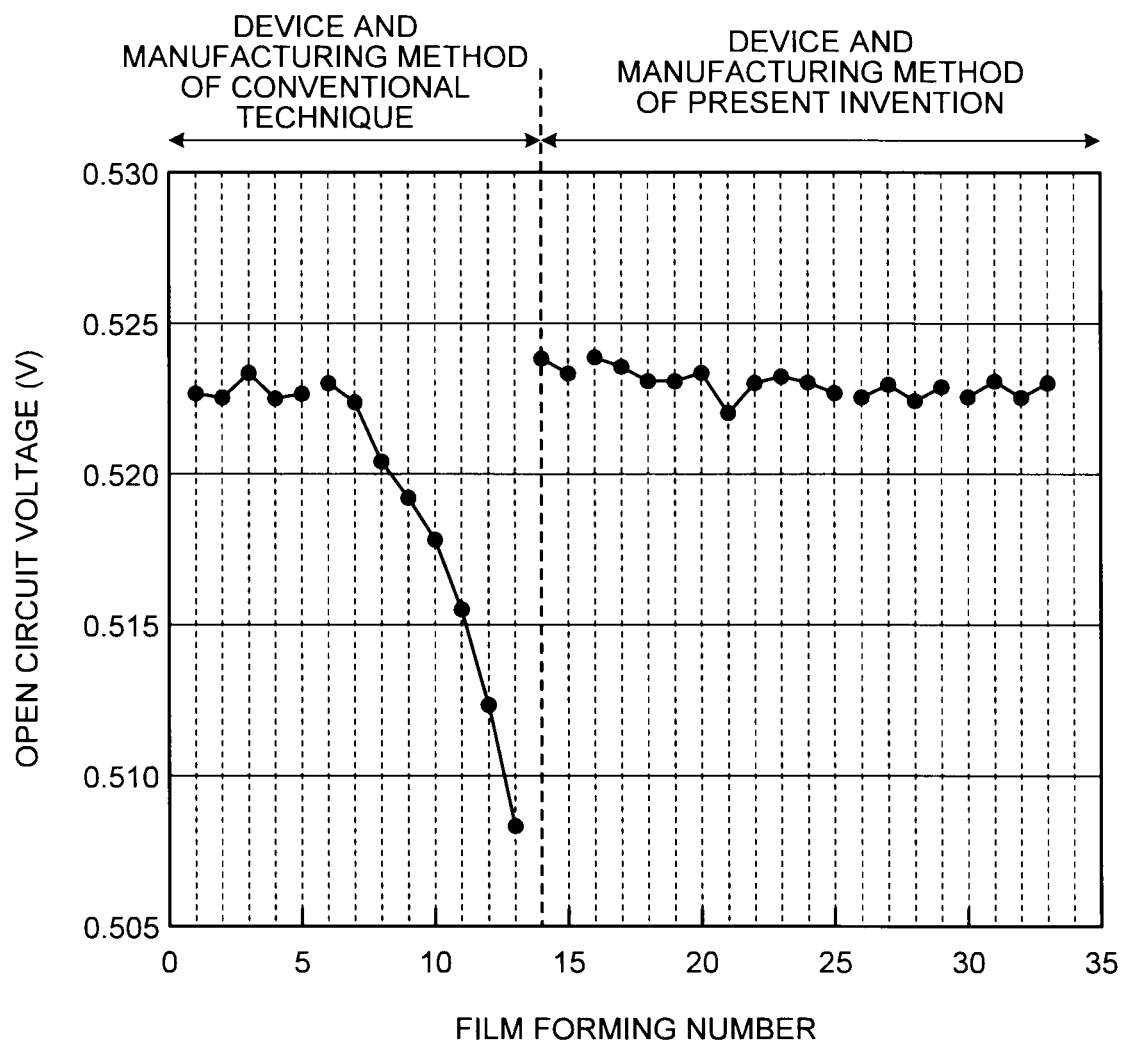
FIG. 21 is a characteristic diagram of transitions of open circuit voltages of thin-film solar battery cells (microcrystalline silicon cells) that are continuously manufactured by the manufacturing device of a microcrystalline silicon film according to the fourth embodiment of the present invention.

FIG. 21 is a characteristic diagram showing transitions of an open circuit voltage (Voc) when 33 thin-film solar battery cells (microcrystalline silicon cells) are continuously manufactured by the manufacturing device of a microcrystalline silicon film according to the fourth embodiment and by a conventional manufacturing device. In FIG. 21, film forming numbers 1 to 14 denote open circuit voltages (Voc) of solar battery cells that are manufactured by the conventional manufacturing device. In FIG. 21, film forming numbers 15 to 33 denote open circuit voltages (Voc) of solar battery cells that are manufactured by the manufacturing device of a microcrystalline silicon film according to the fourth embodiment. Both the manufacturing device of a microcrystalline silicon film according to the fourth embodiment and the conventional manufacturing device remove the residual films by cleaning the film forming chamber 4 at each film formation.

As is clear from FIG. 21, when the conventional manufacturing device manufactures microcrystalline silicon cells, the open circuit voltage (Voc) decreases along a continuous manufacturing of the thin-film solar battery cells (microcrystalline silicon cells). On the other hand, when the manufacturing device according to the fourth embodiment continuously manufactures thin-film solar battery cells (microcrystalline silicon cells), the open circuit voltage (Voc) keeps a substantially constant value. As explained above, thin-film solar battery cells having certain power-generation efficiency can be continuously and stably manufactured by achieving a device that feeds to the film forming chamber 4 only the fluorine-atom radicals 56 that are electrically neutral from the cleaning gas plasma 55 generated by the radical generation chamber 8.

As described above, the manufacturing device of a microcrystalline silicon film according to the fourth embodiment captures ionic species that are present in the plasma 55, and introduces only the electrically-neutral fluorine-atom radicals 56 into the film forming chamber 4, thereby suppressing ion damage on the internal wall of the film forming chamber 4. As a result, excellent uniform cleaning having small ion damage can be performed to an internal wall of the film forming chamber 4 and the shower head 5.

In the above explanations, although the inside of the film forming chamber 4 is cleaned by generating radicals of cleaning gas in the radical generation chamber 8, a semiconductor film having silicon as its primary component can be also etched by using radicals of the same type of gas. Also in this case, excellent uniform cleaning having less ion damage can be achieved. Further, a film forming device and an etching device can be realized by one unit, and thus an installation area of these devices can be reduced even though they have multiple processes.

Furthermore, preprocessing such as irradiating radicals of the radical generation chamber 8 onto a substrate can be performed before plasma film formation of raw material gas. For example, as preprocessing of a substrate, adhesion of a film can be improved in a process of cleaning the surface or etching the substrate surface.

INDUSTRIAL APPLICABILITY

As described above, the plasma CVD apparatus according to the present invention is useful for a case when a uniform hydrogen-passivation process is performed to an entire surface of a formed film. In addition, the plasma CVD apparatus can clean an internal wall of a film forming chamber without causing any damage thereon, and is useful to maintain film forming stability.

| Reference Signs List | |
| --- | --- |
| 1 | SUBSTRATE STAGE |
| 2 | TRANSLUCENT INSULATING SUBSTRATE |
| 3 | MICROCRYSTALLINE SILICON FILM |
| 4 | FILM FORMING CHAMBER |
| 5 | SHOWER HEAD |
| 6 | PIPE |
| 6a | VALVE |
| 7 | FILM FORMING PRECURSOR |
| 8 | RADICAL GENERATION CHAMBER |
| 9 | SHUTTER |
| 10 | PIPE |
| 10a | VALVE |
| 11 | POWER SOURCE |
| 12 | MICROWAVE |
| 13 | WINDOW |
| 14 | MICROWAVE PLASMA |
| 15 | HYDROGEN RADICAL |
| 16 | ELECTROMAGNET |
| 17 | POWER SOURCE |
| 18 | EXHAUST PIPE |
| 21 | MODULE |
| 22 | TRANSLUCENT INSULATING SUBSTRATE |
| 23 | TRANSPARENT ELECTRODE LAYER |
| 24 | P-TYPE MICROCRYSTALLINE SILICON FILM (μc-Si FILM) |
| 25 | I-TYPE MICROCRYSTALLINE SILICON FILM (μc-Si FILM) |
| 26 | N-TYPE MICROCRYSTALLINE SILICON FILM (μc-Si FILM) |
| 27 | PHOTOELECTRIC CONVERSION LAYER |
| 28 | BACK-SURFACE ELECTRODE LAYER |
| 31 | MODULE |
| 41 | WIRING FOR APPLYING BIAS VOLTAGE |
| 42 | HYDROGEN ION |
| 51 | MICROCRYSTALLINE-SILICON INITIAL FILM HAVING HYDROGEN PASSIVATION PROCESS PERFORMED THEREON |
| 51a | MICROCRYSTALLINE-SILICON INITIAL FILM |
| 52 | MICROCRYSTALLINE SILICON BULK |
| 53 | MICROCRYSTALLINE SILICON BULK HAVING HYDROGEN PASSIVATION PROCESS PERFORMED THEREON |
| 54 | CLEANING-GAS SUPPLY PIPE |
| 55 | CLEANING GAS PLASMA |
| 56 | FLUORINE-ATOM RADICAL |
| 57 | RESIDUAL FILM ADHERED ON INTERNAL WALL OF FILM FORMING CHAMBER |
| 58 | RESIDUAL FILM ADHERED ON SHOWER HEAD |
| 59 | DIRECT-CURRENT-BIAS-APPLICATION POWER SOURCE TO SHUTTER |
| 60 | CLEANING GAS ION |
| 61 | SHUTTER UPPER PLATE |
| 62 | SHUTTER LOWER PLATE |
| 63 | HOLE |
| 64 | HOLE |
| 65 | SHUTTER O-RING |

The invention claimed is:

1. A plasma CVD apparatus comprising:
   a film forming chamber;
   a holding member that holds a substrate to be processed that is set in the film forming chamber;
   a shower head that is set in the film forming chamber to face the holding member, and supplies raw material gas and generates a plasma of the raw material gas;
   a radical generation chamber that is set at an opposite side of the shower head relative to the holding member and generates radicals of process gas; and
   an openable and closable shutter that is provided between the shower head and the radical generation chamber,
   wherein the radical generation chamber and the shower head are partitioned by a wall having a plurality of openings, and all the openings are opened and closed by the shutter,
   the openings are distributed in a region of a size equal to or larger than a size of the holding member on the wall, and sizes in vertical direction and lateral direction of the shutter and the shower head are larger than sizes in vertical direction and lateral direction of the holding member, respectively.

2. The plasma CVD apparatus according to claim 1, wherein
   a size of the radical generation chamber is larger than a size of the holding member.

3. The plasma CVD apparatus according to claim 1, wherein the shutter includes a bias-voltage applying unit that applies a direct-current bias voltage to the shutter.

4. The plasma CVD apparatus according to claim 1, wherein the radical generation chamber generates the radicals by dissociating radical raw material gas by a plasma.

5. The plasma CVD apparatus according to claim 1, wherein the plasma CVD apparatus supplies raw material gas into the film forming chamber in a state that the shutter is closed, generates a plasma of the raw material gas, deposits a film and forms the film on a surface of the substrate to be processed by decomposing the raw material gas by the plasma, and thereafter introduces radicals generated in the radical generation chamber into the film forming chamber by opening the shutter.

6. The plasma CVD apparatus according to claim 1, further comprising a cleaning-gas supply unit that supplies cleaning gas for cleaning inside of the film forming chamber to the radical generation chamber, and a direct-current bias application power source to the shutter, wherein
   radicals of the cleaning gas are generated by dissociating the cleaning gas by a plasma in the radical generation chamber.

7. A method for manufacturing a semiconductor film using a plasma CVD apparatus, the plasma CVD apparatus including: a film forming chamber; a holding member that holds a substrate to be processed that is set in the film forming chamber; a shower head that is set in the film forming chamber to face the holding member, and supplies raw material gas and generates a plasma of the raw material gas; a radical generation chamber that is set at an opposite side of the shower head relative to the holding member and generates radicals of process gas; and an openable and closable shutter that is provided between the shower head and the radical generation chamber, wherein the radical generation chamber and the shower head are partitioned by a wall having a plurality of openings, and all the openings are opened and closed by the shutter, the openings are distributed in a region of a size equal to or larger than a size of the holding member on the wall, and sizes in vertical direction and lateral direction of the shutter and the shower head are larger than sizes in vertical direction and lateral direction of the holding member, respectively, wherein the method comprising:

a first step of closing the shutter in a state that the substrate to be processed is held by the holding member in the film forming chamber in a vacuum atmosphere, generating a plasma of the raw material gas while supplying the raw material gas to a film forming surface of the substrate to be processed, decomposing the raw material gas by the plasma, and depositing the decomposed raw material gas on the film forming surface, thereby forming the semiconductor film on the film forming surface; and a second step of generating radicals by a plasma by introducing radical raw material gas into the radical generation chamber, and then opening the shutter, introducing the radicals into the film forming chamber via the shower head, and irradiating an entire surface of the semiconductor film with the radicals in a vacuum atmosphere.

8. The method for manufacturing a semiconductor film according to claim 7, wherein at the second step, the radicals are introduced into the film forming chamber via the shower head in a state that a direct-current bias voltage is applied to the shutter.

9. The method for manufacturing a semiconductor film according to claim 7, wherein a microcrystalline silicon film is formed as the semiconductor film at the first step, and a passivation process is performed by irradiating the microcrystalline silicon film with hydrogen radicals as the radicals at the second step.

10. The method for manufacturing a semiconductor film according to claim 9, wherein the passivation process at the second step is performed by interrupting film formation of the microcrystalline silicon film in a middle of the first step, the film formation of the microcrystalline silicon film at the first step is performed again, and the passivation process at the second step is performed again after the film formation of the microcrystalline silicon film is finished.

11. A method for manufacturing a thin-film solar cell, the thin-film solar cell including: a first electrode layer made of a transparent conductive film; a photoelectric conversion layer having a P-type microcrystalline silicon film, an I-type microcrystalline silicon film, and an N-type microcrystalline silicon film stacked thereon, and performing a photoelectric conversion; and a second electrode layer made of a conductive film that reflects light, the layers being stacked in this order on a translucent insulating substrate, the method comprising:

a first step of forming the first electrode layer on the translucent insulating substrate;

a second step of forming the photoelectric conversion layer by sequentially stacking the P-type microcrystalline silicon film, the I-type microcrystalline silicon film, and the N-type microcrystalline silicon film on the first electrode layer; and a third step of forming the second electrode layer on the photoelectric conversion layer, wherein at the second step, using a plasma CVD apparatus comprising: a film forming chamber; a holding member that holds a substrate to be processed that is set in the film forming chamber; a shower head that is set in the film forming chamber to face the holding member, and supplies raw material gas and generates a plasma of the raw material gas; a radical generation chamber that is set at an opposite side of the shower head relative to the holding member and generates radicals of process gas; and an openable and closable shutter that is provided between the shower head and the radical generation chamber, wherein the radical generation chamber and the shower head are partitioned by a wall having a plurality of openings, and all the openings are opened and closed by the shutter, the openings are distributed in a region of a size equal to or larger than a size of the holding member on the wall, and sizes in vertical direction and lateral direction of the shutter and the shower head are larger than sizes in vertical direction and lateral direction of the holding member, respectively, raw material gas is supplied through a shower head and the I-type microcrystalline silicon film is formed in a vacuum atmosphere, and thereafter, a passivation process is performed by applying hydrogen radicals generated by the radical generation chamber through the shower head onto an entire surface of the I-type microcrystalline silicon film from above the I-type microcrystalline silicon film in a vacuum atmosphere.

12. The method for manufacturing a thin-film solar cell according to claim 11, wherein after the passivation process is performed by interrupting film formation of the I-type microcrystalline silicon film in a middle of the film formation, the film formation of the I-type microcrystalline silicon film is performed again, and the passivation process is performed again after the film formation of the I-type microcrystalline silicon film is finished.

* * * * *